United States Patent
Noh et al.

(10) Patent No.: US 11,894,504 B2
(45) Date of Patent: Feb. 6, 2024

(54) DISPLAY APPARATUS HAVING A SUBSTRATE HOLE

(71) Applicant: LG Display Co., Ltd., Seoul (KR)

(72) Inventors: So-Young Noh, Goyang-si (KR); So-Yeon Je, Paju-si (KR); Ki-Tae Kim, Seoul (KR); Kyeong-Ju Moon, Paju-si (KR); Hyuk Ji, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 538 days.

(21) Appl. No.: 16/943,889

(22) Filed: Jul. 30, 2020

(65) Prior Publication Data

US 2021/0036197 A1 Feb. 4, 2021

(30) Foreign Application Priority Data

Jul. 31, 2019 (KR) ........................ 10-2019-0093100

(51) Int. Cl.
*H01L 33/62* (2010.01)
*H01L 33/44* (2010.01)
*H01L 33/38* (2010.01)
*H01L 33/54* (2010.01)

(52) U.S. Cl.
CPC ............ *H01L 33/62* (2013.01); *H01L 33/382* (2013.01); *H01L 33/44* (2013.01); *H01L 33/54* (2013.01)

(58) Field of Classification Search
CPC ....... H01L 33/62; H01L 33/382; H01L 33/44; H01L 33/54; H01L 25/167; H01L 25/0753; H01L 27/1218; H10K 59/12; H10K 59/00; H10K 50/84
See application file for complete search history.

(56) References Cited

U.S. PATENT DOCUMENTS

| 10,748,974 | B2* | 8/2020 | Lee ..................... H01L 27/1218 |
| 11,647,646 | B2* | 5/2023 | Ji ........................... H10K 71/00 |
| | | | 257/79 |
| 2004/0096771 | A1 | 5/2004 | Kashiwagi et al. |
| 2004/0101988 | A1 | 5/2004 | Roman, Jr. et al. |
| 2012/0205700 | A1* | 8/2012 | Tanada ................. H10K 50/814 |
| | | | 438/46 |

(Continued)

FOREIGN PATENT DOCUMENTS

| CN | 109742264 A | 5/2019 |
| KR | 10-2015-0067974 A | 6/2015 |

(Continued)

*Primary Examiner* — Su C Kim
(74) *Attorney, Agent, or Firm* — Birch, Stewart, Kolasch & Birch, LLP

(57) ABSTRACT

A display apparatus is provided. The display apparatus can include a substrate hole penetrating a device substrate, light-emitting devices spaced away from the substrate hole, and at least one separating device between the substrate hole and the light-emitting devices. Each of the light-emitting devices can include a light-emitting layer between a first electrode and a second electrode. The separating device can surround the substrate hole. The separating device can include at least one under-cut structure. The under-cut structure can include a depth and a length, which are larger than a thickness of the light-emitting layer. Thus, in the display apparatus, the damage of the light-emitting devices due to external moisture permeating through the substrate hole can be prevented.

20 Claims, 14 Drawing Sheets

(56) References Cited

U.S. PATENT DOCUMENTS

| | | | |
|---|---|---|---|
| 2017/0148856 A1* | 5/2017 | Choi | H01L 27/3258 |
| 2019/0081273 A1 | 3/2019 | Sung et al. | |
| 2019/0148672 A1 | 5/2019 | Seo et al. | |
| 2019/0181184 A1* | 6/2019 | Hu | H10K 59/122 |
| 2020/0083475 A1* | 3/2020 | Kang | H10K 50/84 |
| 2021/0226163 A1 | 7/2021 | Ji et al. | |

FOREIGN PATENT DOCUMENTS

| | | |
|---|---|---|
| KR | 10-2017-0059864 A | 5/2017 |
| KR | 10-2019-0018120 A | 2/2019 |

\* cited by examiner

DISPLAY APPARATUS HAVING A SUBSTRATE HOLE

CROSS-REFERENCE TO RELATED APPLICATIONS

This application claims the priority benefit of Korean Patent Application No. 10-2019-0093100, filed in the Republic of Korea on Jul. 31, 2019, the entire contents of which are hereby expressly incorporated by reference as if fully set forth herein into the present application.

BACKGROUND OF THE INVENTION

Field of the Invention

The present invention relates to a display apparatus including a substrate hole which penetrates a device substrate.

Discussion of the Related Art

Generally, an electronic appliance, such as a monitor, a TV, a laptop computer and a digital camera, includes a display apparatus to realize an image. For example, the display apparatus can include light-emitting devices. Each of the light-emitting devices can emit light displaying a specific color. For example, each of the light-emitting devices can include a light-emitting layer between a first electrode and a second electrode.

A peripheral appliance such as a camera, a speaker and a sensor can be mounted in the display apparatus. For example, the display apparatus can include a substrate hole penetrating a device substrate which supports the light-emitting devices. The substrate hole can be disposed among the light-emitting devices. The peripheral appliance can be inserted into the substrate hole.

However, in the display apparatus, external moisture can permeate through the substrate hole. The external moisture permeating through the substrate hole can move to the light-emitting device adjacent the substrate hole through the light-emitting layer. Thus, in the display apparatus, the light-emitting devices which are disposed adjacent the substrate hole may be damaged due to the external moisture permeating through the substrate hole.

SUMMARY OF THE INVENTION

Accordingly, the present invention is directed to a display apparatus that substantially obviates one or more problems due to limitations and disadvantages of the related art.

An object of the present invention is to provide an improved display apparatus capable of preventing damage of a light-emitting device due to external moisture permeating through a substrate hole.

Another object of the present invention is to provide a display apparatus capable of simplifying a process for blocking the external moisture.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a display apparatus comprising a substrate hole penetrating a device substrate. A light-emitting device is disposed on the device substrate. The light-emitting device is spaced away from the substrate hole. The light-emitting device includes a first electrode, a light-emitting layer and a second electrode, which are sequentially stacked. At least one separating device is disposed between the substrate hole and the light-emitting device. The separating device includes at least one under-cut structure. A depth and a length of the under-cut structure are larger than a thickness of the light-emitting layer.

The under-cut structure of the separating device can be in contact with the second electrode.

The separating device can have a structure in which wide patterns and narrow patterns are repeatedly stacked. The narrow patterns can include a material different from the wide patterns.

A width of each narrow pattern can be smaller than a width of each wide pattern. At least one of the narrow patterns can include a conductive material.

A separation insulating layer can be disposed between the device substrate and the light-emitting device. A first thin film transistor can be disposed between the device substrate and the separation insulating layer. A second thin film transistor can be disposed between the separation insulating layer and the light-emitting device. An over-coat layer can be disposed between the second thin film transistor and the light-emitting device. Each of the first thin film transistor and the second thin film transistor can include a gate electrode, a source electrode and a drain electrode. Each of the narrow patterns can include the same material as one of the gate electrode, the source electrode and the drain electrode.

A semiconductor pattern of the first thin film transistor can include a low-temperature poly-silicon (LTPS). A semiconductor pattern of the second thin film transistor can include an oxide semiconductor.

Each of the first thin film transistor and the second thin film transistor can further include a gate insulating layer between the semiconductor pattern and the gate electrode, and an interlayer insulating layer between the gate electrode and the source and drain electrodes. Each of the wide patterns can include the same material as one of the separation insulating layer, the gate insulating layer, the interlayer insulating layer and the over-coat layer.

A thickness of each wide pattern can be larger than a thickness of each narrow pattern.

In another embodiment, the display apparatus comprises a device substrate. The device substrate includes a second region surrounded by a first region, and a third region disposed outside the second region. A substrate hole penetrates the first region of the device substrate. A light-emitting device is disposed on the third region of the device substrate. The light-emitting device includes a light-emitting layer between a first electrode and a second electrode. At least one separating device is disposed on the second region of the device substrate. The separating device has a structure in which a wide pattern and a narrow pattern are repeatedly stacked at least once. The narrow pattern has a smaller width than the wide pattern. A thickness of the narrow pattern is larger than a thickness of the wide pattern. A distance between a side surface of the wide pattern and a side surface of the narrow pattern is larger than a thickness of the light-emitting layer.

The wide pattern and the narrow pattern can include an insulating material.

The uppermost portion of the separating device can include the wide pattern.

A first over-coat layer and a second over-coat layer can be sequentially stacked between the device substrate and the light-emitting device. The wide pattern disposed at the uppermost portion of the separating device can include the same material as the second over-coat layer.

A thin film transistor can be disposed between the device substrate and the light-emitting device. A narrow pattern can include the same material as a gate insulating layer or an interlayer insulating layer of the thin film transistor.

The narrow pattern can include silicon oxide based material.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 15B is an enlarged view of an area P7 in FIG. 15A.

DETAILED DESCRIPTION OF THE EMBODIMENTS

Figure 1:
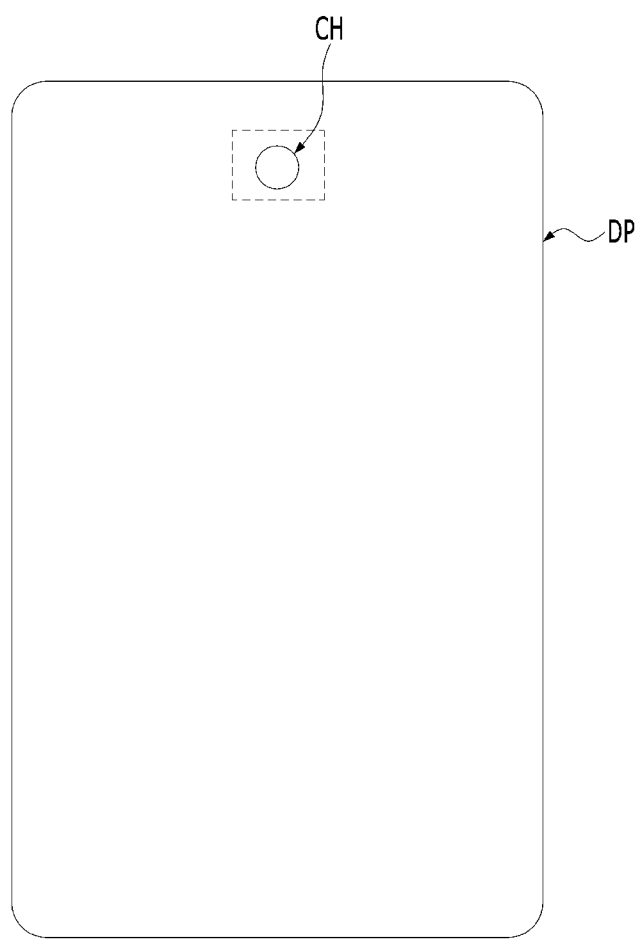
FIG. 1 is a view schematically showing a display apparatus according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as "first" and "second" can be used to distinguish any one element with another element and may not define any order. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 2:
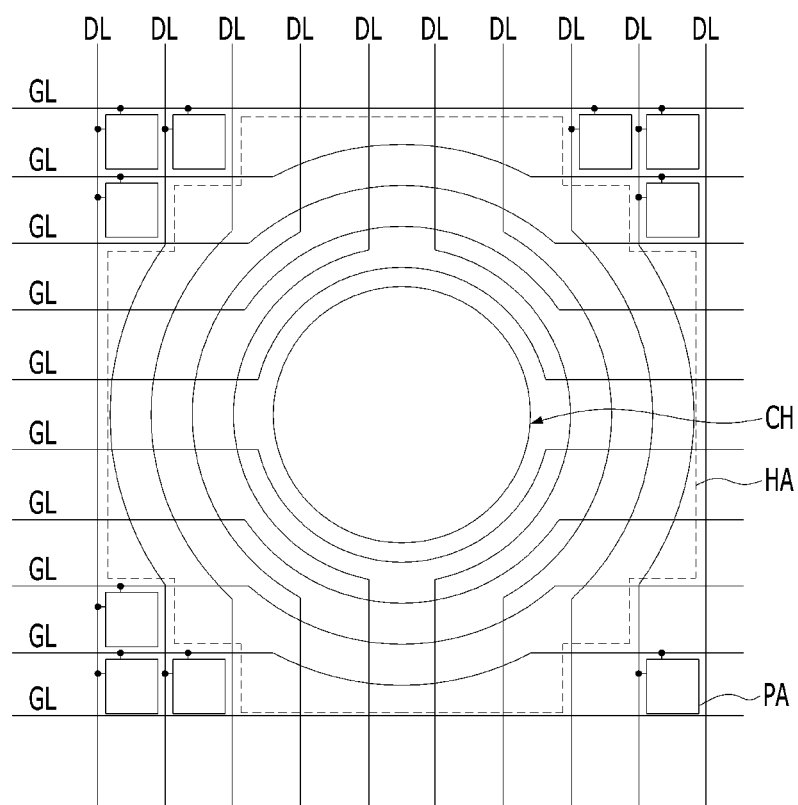
FIG. 2 is an enlarged view showing a peripheral of a substrate hole in the display apparatus according to the embodiment of the present invention.
Figure 3:
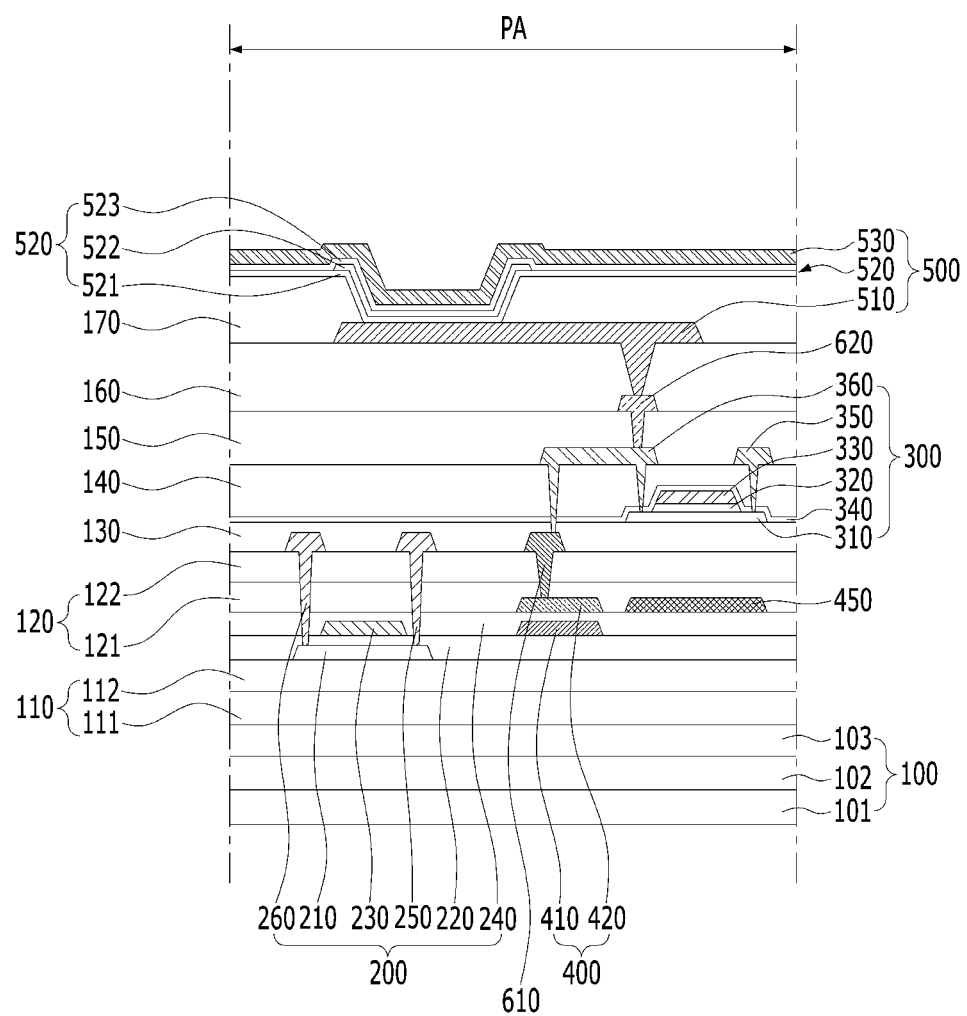
FIG. 3 is a view showing a cross-section of a pixel in the display apparatus according to the embodiment of the present invention.
Figure 4A:
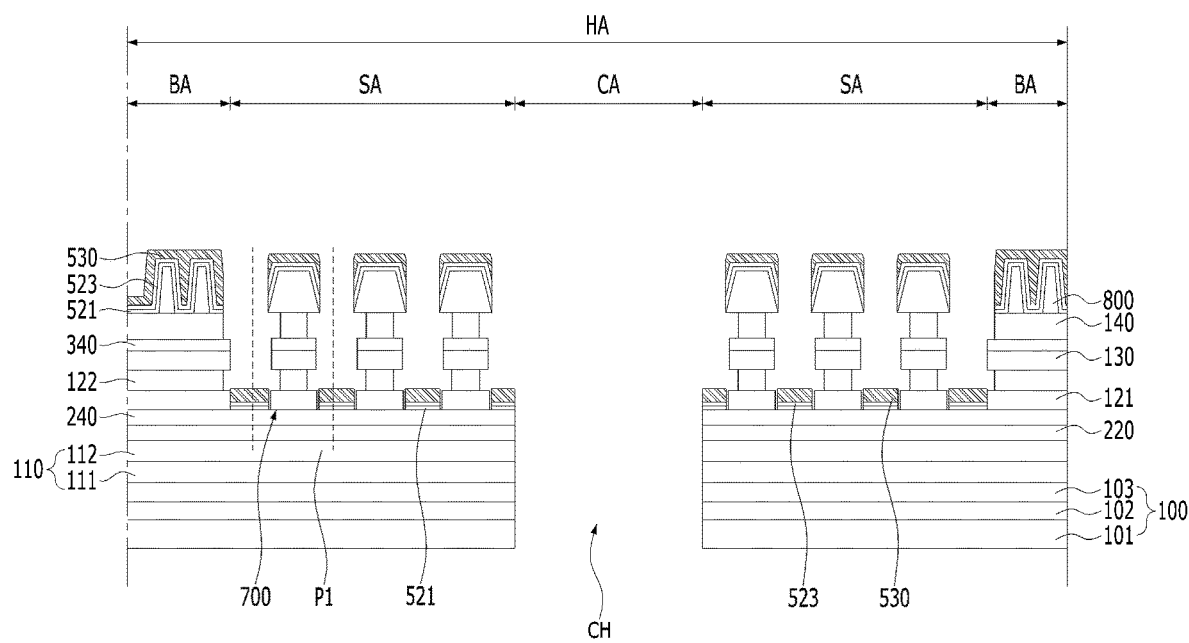
FIG. 4A is a view showing a cross-section of a peripheral region of the substrate hole in the display apparatus according to the embodiment of the present invention.
Figure 4B:
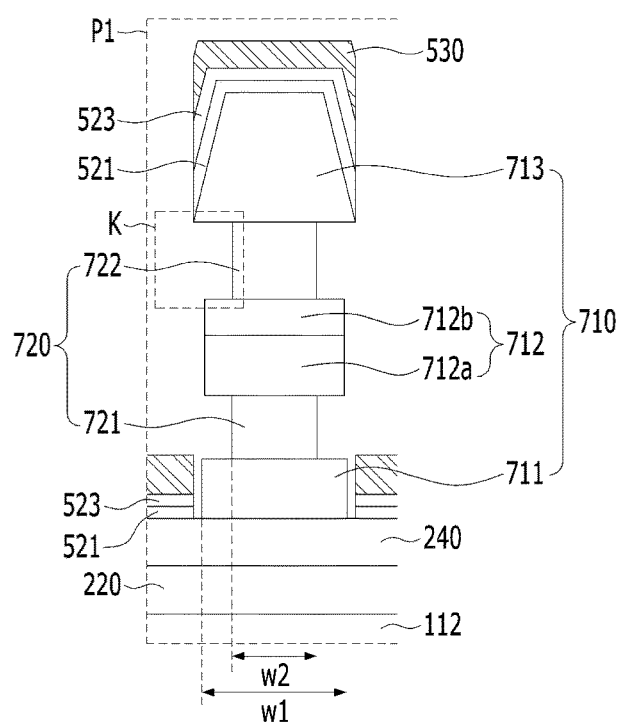
FIG. 4B is an enlarged view of an area P1 in FIG. 4A.
Figure 5:
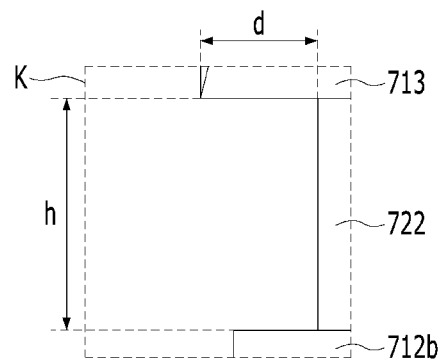
FIG. 5 is an enlarged view of an area K in FIG. 4B.

FIG. 1 is a view schematically showing a display apparatus according to an embodiment of the present invention. FIG. 2 is an enlarged view showing a peripheral of a substrate hole in the display apparatus according to the embodiment of the present invention. FIG. 3 is a view showing a cross-section of a pixel in the display apparatus according to the embodiment of the present invention. FIG. 4A is a view showing a cross-section of a peripheral region of the substrate hole in the display apparatus according to the embodiment of the present invention. FIG. 4B is an enlarged view of an area P1 in FIG. 4A. FIG. 5 is an enlarged view of an area K in FIG. 4B.

Referring to FIGS. 1 to 5, the display apparatus according to the embodiment of the present invention can include a device substrate 100. The device substrate 100 can include an insulating material. For example, the device substrate 100 can include glass or plastic. The device substrate 100 can have a multi-layer structure. For example, the device substrate 100 can have a structure in which an insulating layer 102 is disposed between a first substrate layer 101 and a second substrate layer 103. The second substrate layer 103 can include the same material as the first substrate layer 101. For example, the first substrate layer 101 and the second substrate layer 103 can include plastic. The insulating layer 102 can include an insulating material.

The device substrate 100 can include pixels PA defined by gate lines GL and data lines DL. A light-emitting device 500 can be disposed in each pixel PA. Each of the light-emitting devices 500 can emit light displaying a specific color. For example, each of the light-emitting devices 500 can include a first electrode 510, a light-emitting layer 520 and a second electrode 530, which are sequentially stacked.

The first electrode 510 can include a conductive material. The first electrode 510 can include a metal having a relatively high reflectance. The first electrode 510 can have a multi-layer structure. For example, the first electrode 510 can have a structure in which a reflective electrode formed of a metal such as aluminum (Al) and silver (Ag) is disposed between transparent electrodes formed of a transparent conductive material such as ITO and IZO.

The light-emitting layer 520 can generate light having luminance corresponding to a voltage difference between the first electrode 510 and the second electrode 530. For example, the light-emitting layer 520 can include an emission material layer (EML) 522 having an emission material. The emission material can include an organic material, an inorganic material or a hybrid material. For example, the display apparatus according to the embodiment of the present invention can be an organic light-emitting display apparatus including the light-emitting layer 520 formed of an organic material.

The light-emitting layer 520 can have a multi-layer structure in order to increase luminous efficacy. For example, the light-emitting layer 520 can include at least one first organic layer 521 between the first electrode 510 and the emission material layer 522, and at least one second organic layer 523 between the emission material layer 522 and the second electrode 530. The first organic layer 521 can include at least one of a hole injection layer (HIL) and a hole transporting layer (HTL). The second organic layer 523 can include at least one of an electron transporting layer (ETL) and an electrode injection layer (EIL). However, the disclosure is not limited thereto. For example, the first organic layer 521 can include at least one of the electron transporting layer (ETL) and the electrode injection layer (EIL), and the second organic layer 523 can include at least one of the hole injection layer (HIL) and the hole transporting layer (HTL).

The second electrode 530 can include a conductive material. The second electrode 530 can include a material different from the first electrode. For example, the second electrode 530 can be a transparent electrode formed of a transparent conductive material, such as ITO and IZO. Thus, in the display apparatus according to the embodiment of the present invention, the light generated from the light-emitting layer 520 of each pixel PA can emit outside through the second electrode 530.

A driving current corresponding to a gate signal applied by a corresponding gate line GL and a data signal applied by a corresponding data line DL can be supplied to each light-emitting device 500. For example, a driving circuit electrically connected to the corresponding light-emitting device 500 can be disposed in each pixel PA. The driving circuit can control the operation of the corresponding light-emitting device 500 according to the gate signal and the data signal. For example, the driving circuit can include a first thin film transistor 200, a second thin film transistor 300 and a storage capacitor 400.

The first thin film transistor 200 can include a first semiconductor pattern 210, a first gate insulating layer 220, a first gate electrode 230, a first interlayer insulating layer 240, a first source electrode 250 and a first drain electrode 260.

The first semiconductor pattern 210 can be disposed close to the device substrate 100. The first semiconductor pattern 210 can include a semiconductor. For example, the first semiconductor pattern 210 can include a poly-silicon which is a poly crystalline semiconductor. The display apparatus according to the embodiment of the present invention is described that the first semiconductor pattern 210 includes a low-temperature poly silicon (LTPS).

The first semiconductor pattern 210 can include a first source region, a first drain region and a first channel region. The first channel region can be disposed between the first source region and the first drain region. The first channel region can have a lower conductivity than the first source region and the first drain region. For example, the first source region and the first drain region can have a higher content of conductive impurities than the first channel region.

The first gate insulating layer 220 can be disposed on the first semiconductor pattern 210. The first gate insulating layer 220 can extend beyond the first semiconductor pattern 210. The first gate insulating layer 220 can include an insulating material. For example, the first gate insulating layer 220 can include a silicon oxide based material (SiOx). The silicon oxide based material (SiOx) can include silicon dioxide ($SiO_2$).

The first gate electrode 230 can be disposed on the first gate insulating layer 220. For example, the first gate electrode 230 can overlap the first channel region of the first semiconductor pattern 210. The first gate electrode 230 can be insulated from the first semiconductor pattern 210 by the first gate insulating layer 220. The first gate electrode 230 can include a conductive material. For example, the first gate electrode 230 can include a metal, such as aluminum (Al), chromium (Cr), copper (Cu), titanium (Ti), molybdenum (Mo) and tungsten (W).

The first interlayer insulating layer 240 can be disposed on the first gate insulating layer 220 and the first gate electrode 230. The first interlayer insulating layer 240 can extend along the first gate insulating layer 220. The first interlayer insulating layer 240 can include an insulating material. The first interlayer insulating layer 240 can include a material different from the first gate insulating layer 220. For example, the first interlayer insulating layer 240 can include silicon nitride based material (SiNx).

The first source electrode 250 can be disposed on the first interlayer insulating layer 240. The first source electrode 250 can be electrically connected to the first source region of the first semiconductor pattern 210. For example, the first interlayer insulating layer 240 can include a first source contact hole partially exposing the first source region of the first semiconductor pattern 210. The first source electrode 250 can include a portion overlapping with the first source region of the first semiconductor pattern 210.

The first source electrode 250 can include a conductive material. For example, the first source electrode 250 can include a metal, such as aluminum (Al), chromium (Cr), molybdenum (Mo), tungsten (W) and copper (Cu).

The first drain electrode 260 can be disposed on the first interlayer insulating layer 240. The first drain electrode 260 can be electrically connected to the first drain region of the first semiconductor pattern 210. For example, the first interlayer insulating layer 240 can include a first drain contact hole partially exposing the first drain region of the first semiconductor pattern 210. The first drain electrode 260 can include a portion overlapping with the first drain region of the first semiconductor pattern 210.

The first drain electrode 260 can include a conductive material. For example, the first drain electrode 260 can include a metal, such as aluminum (Al), chromium (Cr), molybdenum (Mo), tungsten (W) and copper (Cu). The first drain electrode 260 can include the same material as the first source electrode 250. For example, the first drain electrode 260 can be formed by the same process as the first source electrode 250.

The first source electrode 250 and the first drain electrode 260 can have a multi-layer structure. For example, each of the first source electrode 250 and the first drain electrode 260 can have a three-layer structure in which an intermediate layer being composed of a titanium (Ti) metal layer is disposed between a lower layer and an upper layer which are composed of an aluminum (Al) metal layer. The second thin film transistor 300 can be formed by a process different from the first thin film transistor 200. For example, the second thin film transistor 300 can be disposed on a separation insulating layer 130 covering the first source electrode 250 and the first drain electrode 260 of the first thin film transistor 200. The separation insulating layer 130 can include an insulating material. The separation insulating layer 130 can include a material different from the first interlayer insulating layer 240. For example, the separation insulating layer 130 can include silicon oxide based material (SiOx).

The second thin film transistor 300 can have the same structure as the first thin film transistor 200. For example, the second thin film transistor 300 can include a second semiconductor pattern 310, a second gate insulating layer 320, a second gate electrode 330, a second interlayer insulating layer 340, a second source electrode 350 and a second drain electrode 360.

The second semiconductor pattern 310 can be disposed close to the separation insulating layer 130. For example, the second semiconductor pattern 310 can be in direct contact with the separation insulating layer 130. The second semiconductor pattern 310 can include a semiconductor. The second semiconductor pattern 310 can include a material different from the first semiconductor pattern 210. For example, the second semiconductor pattern 310 can include an oxide semiconductor, such as IGZO.

The second semiconductor pattern 310 can include a second source region, a second drain region and a second channel region. The second channel region can be disposed between the second source region and the second drain region. The second source region and the second drain region can have a lower resistance than the second channel region. For example, each of the second source region and the second drain region can be a conductorized region. The second channel region can be a region which is not conductorized.

The second gate insulating layer 320 can be disposed on the second semiconductor pattern 310. The second gate insulating layer 320 can include an insulating material. For example, the second gate insulating layer 320 can include silicon oxide based material (SiOx), silicon nitride based material (SiNx) and/or a material having a high dielectric constant (High-K material). The second gate insulating layer 320 can have a multi-layer structure.

The second gate insulating layer 320 can expose the second source region and the second drain region of the second semiconductor pattern 310. The second source region and the second drain region of the second semiconductor pattern 310 may not overlap the second gate insulating layer 320. For example, the second source region and the second drain region of the second semiconductor pattern 310 can be conductorized by an etchant used in a process of patterning the second gate insulating layer 320.

The second gate electrode 330 can be disposed on the second gate insulating layer 320. For example, the second gate electrode 330 can overlap the second channel region of the second semiconductor pattern 310. The second gate electrode 330 can include a conductive material. For example, the second gate electrode 330 can include a metal, such as aluminum (Al), chromium (Cr), copper (Cu), titanium (Ti), molybdenum (Mo) and tungsten (W). The second gate electrode 330 can include the same material as the first gate electrode 230.

The second interlayer insulating layer 340 can be disposed on the second semiconductor pattern 310 and the second gate electrode 330. The second interlayer insulating layer 340 can cover a side surface of the second semiconductor pattern 310. The second interlayer insulating layer 340 can include an insulating material. The second interlayer insulating layer 340 can include a material different from the first interlayer insulating layer 240. For example, the second interlayer insulating layer 340 can include silicon oxide based material (SiOx).

The second source electrode 350 can be disposed on the second interlayer insulating layer 340. The second source electrode 350 can be electrically connected to the second source region of the second semiconductor pattern 310. For example, the second interlayer insulating layer 340 can include a second source contact hole partially exposing the second source region of the second semiconductor pattern 310. The second source electrode 350 can include a portion overlapping with the second source region of the second semiconductor pattern 310.

The second source electrode 350 can include a conductive material. For example, the second source electrode 350 can include a metal, such as aluminum (Al), chromium (Cr), molybdenum (Mo), tungsten (W) and copper (Cu). The second source electrode 350 can include the same material as the first source electrode 250.

The second drain electrode 360 can be disposed on the second interlayer insulating layer 340. The second drain electrode 360 can be electrically connected to the second drain region of the second semiconductor pattern 310. For example, the second interlayer insulating layer 340 can include a second drain contact hole partially exposing the second drain region of the second semiconductor pattern 310. The second drain electrode 360 can include a portion overlapping with the second drain region of the second semiconductor pattern 310.

The second drain electrode 360 can include a conductive material. For example, the second drain electrode 360 can include a metal, such as aluminum (Al), chromium (Cr), molybdenum (Mo), tungsten (W) and copper (Cu). The second drain electrode 360 can include the same material as the second source electrode 350. For example, the second drain electrode 360 can be formed by the same process as the second source electrode 350.

The second source electrode 350 and the second drain electrode 360 can have a multi-layer structure. For example, each of the second source electrode 350 and the second drain electrode 360 can have a three-layer in which an intermediate layer being composed of a titanium (Ti) metal layer is disposed between a lower layer and an upper layer which are composed of an aluminum (Al) metal layer.

The storage capacitor 400 can be formed between the device substrate 100 and the second thin film transistor 300. For example, the storage capacitor 400 can include a first storage electrode 410 disposed on the same layer as the first gate electrode 230, and a second storage electrode 420 on the first storage electrode 410.

The first storage electrode 410 can include a conductive material. The first storage electrode 410 can include a metal, such as aluminum (Al), chromium (Cr), molybdenum (Mo), tungsten (W) and copper (Cu). The first storage electrode 410 can include the same material as the first gate electrode 230. For example, the first storage electrode 410 can be formed by the same process as the first gate electrode 230.

The second storage electrode 420 can include a conductive material. The second storage electrode 420 can include a metal, such as aluminum (Al), chromium (Cr), molybdenum (Mo), tungsten (W) and copper (Cu). The first interlayer insulating layer 240 can extend between the first storage electrode 410 and the second storage electrode 420. The second storage electrode 420 can be disposed on the first interlayer insulating layer 240. The first source electrode 250 and the first drain electrode 260 can be disposed a layer different from the second storage electrode 420. For example, a first intermediate insulating layer 120 covering the second storage electrode 420 can be disposed between the first interlayer insulating layer 240 and the first source electrodes 250, and between the first interlayer insulating layer 240 and the first drain electrode 260. The first interlayer insulating layer 240 and the first intermediate insulating layer 120 can be sequentially stacked between the first gate electrode 230 and the first source electrode 250, and between the first gate electrode 230 and the first drain electrode 260. The second storage electrode 420 can include a material different from the first source electrode 250 and the first drain electrode 260.

The first intermediate insulating layer 120 can include an insulating material. For example, the first intermediate insulating layer 120 can include silicon oxide based material (SiOx) and/or silicon nitride based material (SiNx). The first intermediate insulating layer 120 can have a multi-layer structure. For example, the first intermediate insulating layer 120 can have a stacked structure of a first intermediate layer 121 including silicon oxide based material (SiOx), and a second intermediate layer 122 including silicon nitride based material (SiNx). The first source electrode 250 and the first drain electrode 260 can be disposed on the second intermediate layer 122. However, the disclosure is not limited thereto. For example, the first intermediate insulating layer 120 can be formed as a single layer of the second intermediate layer 122 including silicon nitride based material (SiNx).

The second storage electrode 420 can be electrically connected to the second drain electrode 360 of the second thin film transistor 300. For example, a first intermediate electrode 610 connected to the second storage electrode 420 by penetrating the first intermediate insulating layer 120 can be disposed on the second intermediate layer 122, the second drain electrode 360 can be connected to the first intermediate electrode 610 by penetrating the second interlayer insulating layer 340. The first intermediate electrode 610 can include a conductive material. For example, the first intermediate electrode 610 can include a metal, such as aluminum (Al), chromium (Cr), molybdenum (Mo), tungsten (W) and copper (Cu). The first intermediate electrode 610 can include the same material as the first source electrode 250 and the first drain electrode 260. For example, the first intermediate electrode 610 can be formed by the same process as the first source electrode 250 and the first drain electrode 260.

A light-blocking electrode 450 can be disposed between the first interlayer insulating layer 240 and the first intermediate insulating layer 120. The light-blocking electrode 450 can overlap the second semiconductor pattern 310. The light-blocking electrode 450 can prevent changes in characteristics of the second semiconductor pattern 310 due to external light. For example, the light-blocking electrode 450 can include a metal. The light-blocking electrode 450 can include the same material as the second storage electrode 420. For example, the light-blocking electrode 450 can be formed by the same process as the second storage electrode 420.

A second intermediate insulating layer 140 can be disposed between the second interlayer insulating layer 340 and the second source and drain electrodes 350 and 360. The second source electrode 350 and the second drain electrode 360 can be disposed on the second intermediate insulating layer 140. The second intermediate insulating layer 140 can include an insulating material. The second intermediate insulating layer 140 can include a material different from the second interlayer insulating layer 340. For example, the second intermediate insulating layer 140 can include silicon nitride based material (SiNx). The second source electrode 350 and the second drain electrode 360 can penetrate the second interlayer insulating layer 340 and the second intermediate insulating layer 140.

A buffer insulating layer 110 can be disposed between the device substrate 100 and the driving circuit of each pixel PA. The buffer insulating layer 110 can prevent pollution from the device substrate 100 during a process of forming the driving circuits. For example, the buffer insulating layer 110 can extend between the device substrate 100 and the first semiconductor pattern 210 of each pixel PA. The buffer insulating layer 110 can include an insulating material. For example, the buffer insulating layer 110 can include silicon oxide based material (SiOx) and/or silicon nitride based material (SiNx). The buffer insulating layer 110 can have a multi-layer structure. For example, the buffer insulating layer 110 can have a stacked structure of a first buffer layer 111 and a second buffer layer 112 including a material different from the first buffer layer 111.

A first over-coat layer 150 and a second over-coat layer 160 can be sequentially stacked between the second thin film transistor 300 and the light-emitting device 500 of each pixel PA. The first over-coat layer 150 and the second over-coat layer 160 can remove a thickness difference due to the driving circuit of each pixel PA. For example, a surface of the second over-coat layer 160 toward the light-emitting device 500 of each pixel PA can be a flat surface. The first over-coat layer 150 and the second over-coat layer 160 can include an insulating material. The first over-coat layer 150 and the second over-coat layer 160 can include a material different from the second intermediate insulating layer 140. For example, the first over-coat layer 150 and the second over-coat layer 160 can include an organic insulating material. The second over-coat layer 160 can include a material different from the first over-coat layer 150.

The light-emitting device 500 of each pixel PA can be electrically connected to the second thin film transistor 300 of the corresponding pixel PA. For example, the first electrode 510 of each pixel PA can be electrically connected to the corresponding second drain electrode 360 by penetrating the first over-coat layer 150 and the second over-coat layer 160. The first electrode 510 of each pixel PA can be electrically connected to the corresponding second drain electrode 360 by second intermediate electrode 620. For example, the second intermediate electrode 620 can be disposed between the first over-coat layer 150 and the second over-coat layer 160. In each pixel PA, the second intermediate electrode 620 can be connected to the second drain electrode 360 by penetrating the first over-coat layer 150, and the first electrode 510 can be connected to the second intermediate electrode 620 by penetrating the second over-coat layer 160.

The second intermediate electrode 620 can include a conductive material. For example, the second intermediate electrode 620 can include a metal, such as aluminum (Al), chromium (Cr), molybdenum (Mo), tungsten (W) and copper (Cu). The second intermediate electrode 620 can include a material different from the first intermediate electrode 610.

The light-emitting device 500 of each pixel PA can be independently operated. For example, the first electrode 510 of each pixel PA can be insulated from the first electrode 510 of adjacent pixel PA. An edge of each first electrode 510 can be covered by a bank insulating layer 170. The bank insulating layer 170 can be disposed on the second over-coat layer 160. The light-emitting layer 520 and the second electrode 530 of each pixel PA can be stacked on a portion of the corresponding first electrode 510 exposed by the bank insulating layer 170. The bank insulating layer 170 can include an insulating material. For example, the bank insulating layer 170 can include an organic insulating material. The bank insulating layer 170 can include a material different from the second over-coat layer 160.

At least a portion of the light-emitting layer 520 of each pixel PA can extend onto the bank insulating layer 170. For example, the first organic layer 521 and the second organic layer 523 of each pixel PA can be connected to the first organic layer 521 and the second organic layer 523 of adjacent pixel PA. The emission material layer 522 of each pixel PA can be spaced away from the emission material layer 522 of adjacent pixel PA. The second electrode 530 of each pixel PA can extend onto the bank insulating layer 170. For example, the second electrode 530 of each pixel PA can be connected to the second electrode 530 of adjacent pixel PA.

In the display apparatus according to the embodiment of the present invention, the second thin film transistor 300 of each pixel PA can serve as a driving transistor. Thus, in the display apparatus according to the embodiment of the present invention, the first electrode 510 of each light-emitting device 500 can be connected to the corresponding second thin film transistor 300. However, the disclosure is not limited thereto. For example, the first electrode 510 of each light-emitting device 500 can be connected to the first thin film transistor 200 of the corresponding pixel PA, and the first thin film transistor 200 of each pixel PA can serve as a driving transistor.

A substrate hole CH can be formed in the device substrate 100. The substrate hole CH can penetrate the device substrate 100. The substrate hole CH can be disposed among the pixels PA. For example, the substrate hole CH can be formed among the light-emitting devices 500. The device substrate 100 can include a hole peripheral region HA including a region in which the substrate hole CH is formed. The gate line GL and the data line DL can bypass the substrate hole CH along an edge of the substrate hole CH in the hole peripheral region HA.

The hole peripheral region HA can include a penetrating region CA in which the substrate hole CH is formed, and a separating region SA surrounding the penetrating region CA. For example, the separating region SA can be disposed between the penetrating region CA and the pixels PA.

At least one separating device 700 can be disposed in the separating region SA. The separating device 700 can have a structure in which wide patterns 710 and narrow patterns 720 are repeatedly stacked. For example, each of the wide patterns 710 can include a first wide pattern 711, a second wide pattern 712 and a third wide pattern 713, which are sequentially stacked, and each of the narrow patterns 720 can include a first narrow pattern 721 between the first wide pattern 711 and the second wide pattern 712, and a second narrow pattern 722 between the second wide pattern 712 and the third wide pattern 713. A width w2 of each narrow pattern 720 can be smaller than a width w1 of the first wide pattern 711. Each of the separating devices 700 can include at least one under-cut structure due to a width difference of the wide patterns 710 and the narrow patterns 720.

The under-cut structure can have a depth h (or height h) that is the same as a thickness of the corresponding narrow pattern 720. For example, the depth h of the under-cut structure formed by the third wide pattern 713 and the second narrow pattern 722 can be the same as the thickness of the second narrow pattern 722. A length d (or width d) of the under-cut structure can be the same as a distance between a side surface of the corresponding wide pattern 710 and a side surface of the corresponding narrow pattern 720. For example, the length d of the under-cut structure formed by the third wide pattern 713 and the second narrow pattern 722 can be the same as the distance between a side surface of the third wide pattern 713 and a side surface of the second narrow pattern 722. The depth h and the length d of the under-cut structure can be larger than a thickness of the light-emitting layer 520 which extends on the hole peripheral region HA. For example, the depth h and the length d of the under-cut structure can be larger than a sum of a thickness of the first organic layer 521 and a thickness of the second organic layer 523. For example, the depth h and the length d of the under-cut structure can be larger than 3000 μm, respectively. Thus, in the display apparatus according to the embodiment of the present invention, the light-emitting layer 520 and the second electrode 530 which are deposited on the separating region SA can be completely separated by the separating device 700. For example, the separating device 700 can separate the first organic layer 521 and the second organic layer 523 of the light-emitting layer 520 and the second electrode 530 in the separating region SA. Therefore, in the display apparatus according to the embodiment of the present invention, the permeation of the external moisture via the light-emitting layer 520 can be blocked by the separating device 700. The second electrode 530 can be separated by the under-cut structure of the separating device 700. For example, in the display apparatus according to the embodiment of the present invention, the under-cut structure of the separating device 700 can be exposed by the light-emitting layer 520 and the second electrode 530.

The wide patterns 710 and the narrow patterns 720 can include an insulating material. The narrow patterns 720 can include a material different from the wide patterns 710. For example, the narrow patterns 720 can include a material that is etched faster than the wide patterns 710 by an etchant used in a process of forming the separating device 700. Thus, in the display apparatus according to the embodiment of the present invention, the process of forming the separating device 700 can be simplified.

The first wide pattern 711 can be spaced away from a portion of the light-emitting layer 520 and a portion of the second electrode 530, which are separated by the separating device 700. For example, a width w1 of the first wide pattern 711 can be smaller than a width of the third wide pattern 713 which is disposed at the uppermost portion of the separating device 700.

The separating device 700 can be formed by a process of forming the driving circuit and the light-emitting device 500. For example, a step of forming the separating device 700 can include a step of depositing the first interlayer insulating layer 240, the first intermediate layer 121, the second intermediate layer 122, the separation insulating layer 130, the second interlayer insulating layer 340, the second intermediate insulating layer 140 and the second over-coat layer 160 on the separating region SA, and a step of sequentially etching the first intermediate layer 121, the second intermediate layer 122, the separation insulating layer 130, the second interlayer insulating layer 340, the second intermediate insulating layer 140 and the second over-coat layer 160 using a mask pattern. The first wide pattern 711 can be formed by a process of etching the first intermediate layer 121 on the separating region SA. For example, the first wide pattern 711 can include silicon oxide based material (SiOx). The first narrow pattern 721 can be formed by a process of etching the second intermediate layer 122 on the separating region SA. For example, the first narrow pattern 721 can include silicon nitride based material (SiNx). The second wide pattern 712 can be formed by a process of etching the separation insulating layer 130 and the second interlayer insulating layer 340 on the separating region SA. For example, the second wide pattern 712 can include silicon oxide based material (SiOx). The second wide pattern 712 can have a stacked structure of a lower wide layer 712a and an upper wide layer 712b. The second narrow pattern 722 can be formed by a process of etching the second intermediate insulating layer 140 on the separating region SA. For example, the second narrow pattern 722 can include silicon nitride based material (SiNx). The third wide pattern 713 can be formed by a process of etching the second over-coat layer 160. For example, the third wide pattern 713 can include an organic insulating material. Thus, in the display apparatus according to the embodiment of the present invention, decreasing the process efficiency due to the process of forming the separating device 700 can be minimized.

The hole peripheral region HA can further include a barrier region BA disposed outside the separating region SA. The separating region SA can be disposed between the penetrating region CA and the barrier region BA. At least one dam 800 can be disposed on the barrier region BA.

Accordingly, the display apparatus according to the embodiment of the present invention includes at least one separating device 700 within the separating region SA disposed between the penetrating region CA in which the substrate hole CH is formed, and the pixels PA, wherein the separating device 700 can include at least one under-cut structure, and wherein the depth and the length of the under-cut structure can larger than the thickness of the light-emitting layer 520 of the light-emitting device 500 in each pixel PA. Thus, in the display apparatus according to the embodiment of the present invention, the light-emitting layer 520 can be completely separated by the separating device 700. For example, in the display apparatus according to the embodiment of the present invention, the damage of the light-emitting devices 500 due to the external moisture permeating through the substrate hole CH can be effectively prevented. And, in the display apparatus according to the embodiment of the present invention, the separating device 700 can be formed using the process of forming the driving circuit and the light-emitting device 500 of each pixel PA. Therefore, in the display apparatus according to the embodiment of the present invention, decreasing the process efficiency due to the process of forming the separating device 700 can be prevented.

The display apparatus according to the embodiment of the present invention is described that each of the device substrate 100 and the buffer insulating layer 110 has a multi-layer structure. However, other variations and examples of the display apparatus according to other embodiments of the present disclosure are possible as shown in FIGS. 6 to 15.

Figure 6:
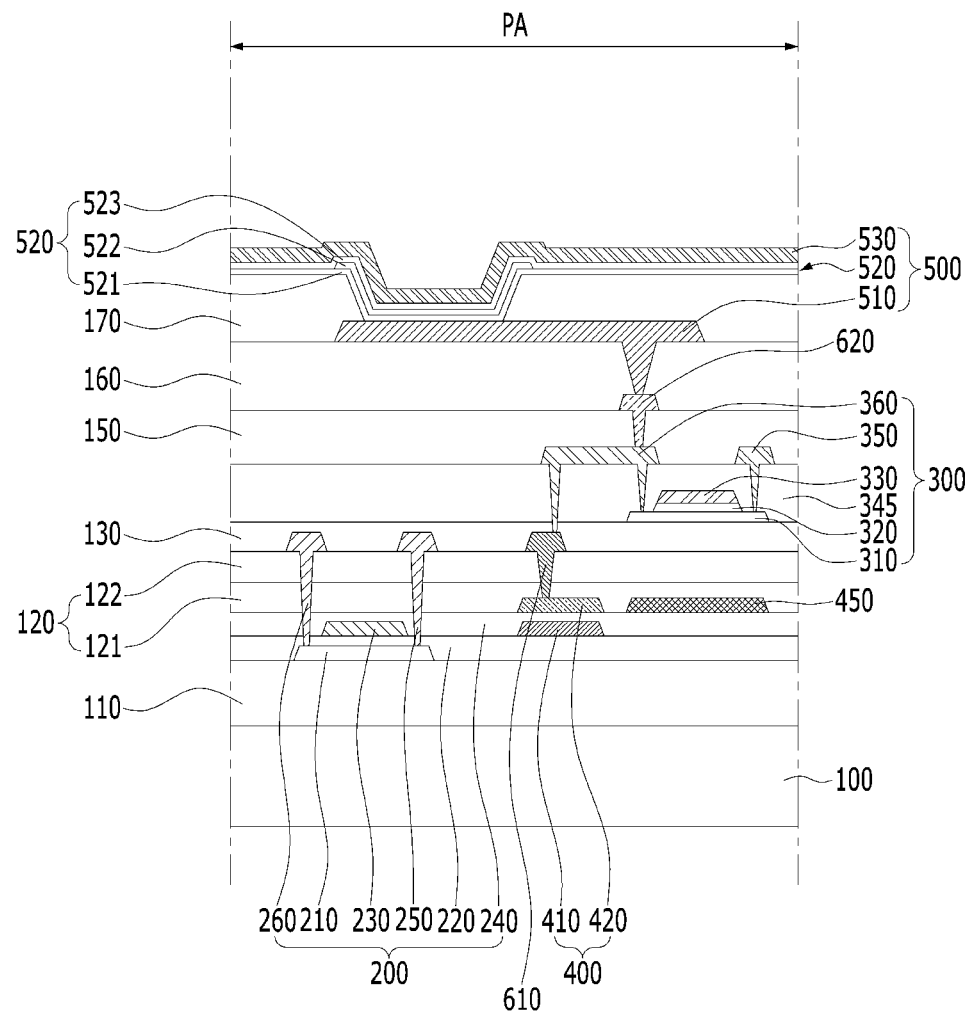
FIGS. 6 to 15B are views respectively showing a display apparatus according to other embodiments of the present invention, where
Figure 7A:
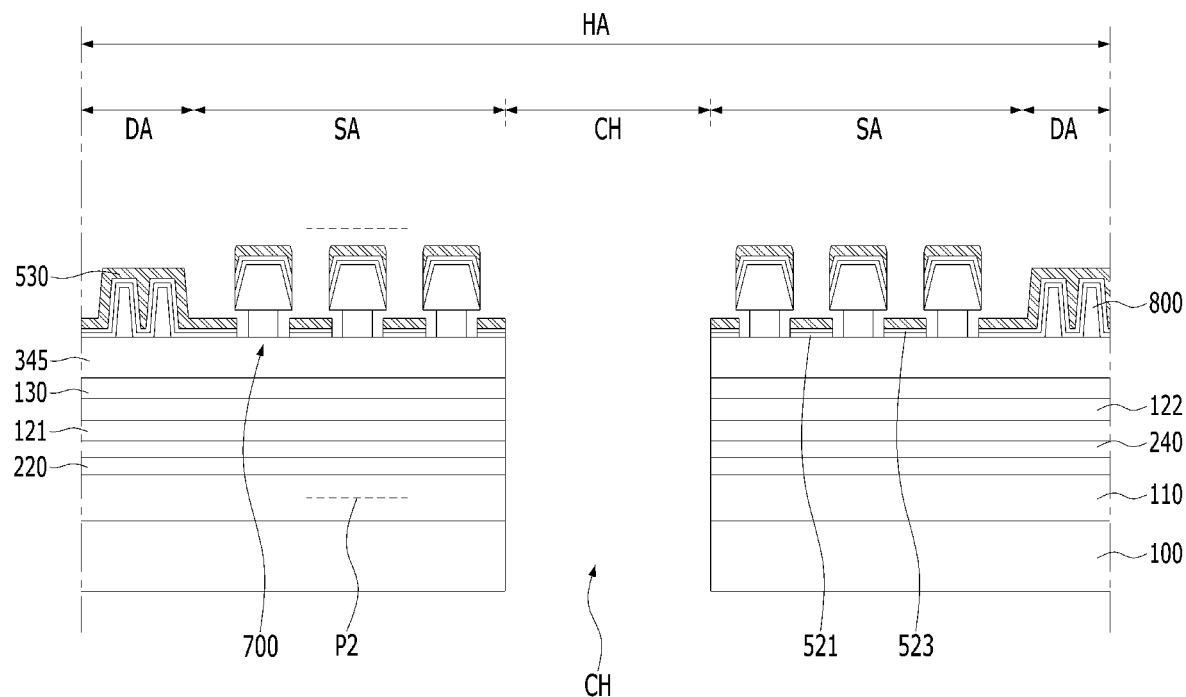
FIG. 7B is an enlarged view of an area P2 in FIG. 7A.
Figure 7B:
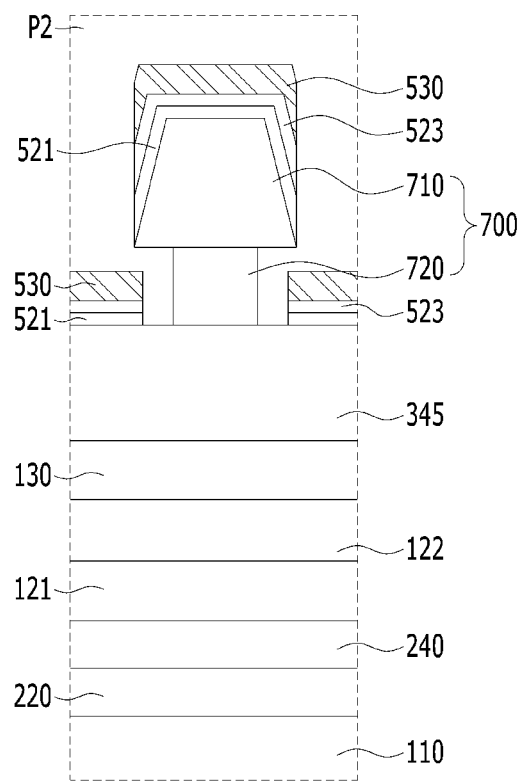
Figure 8A:
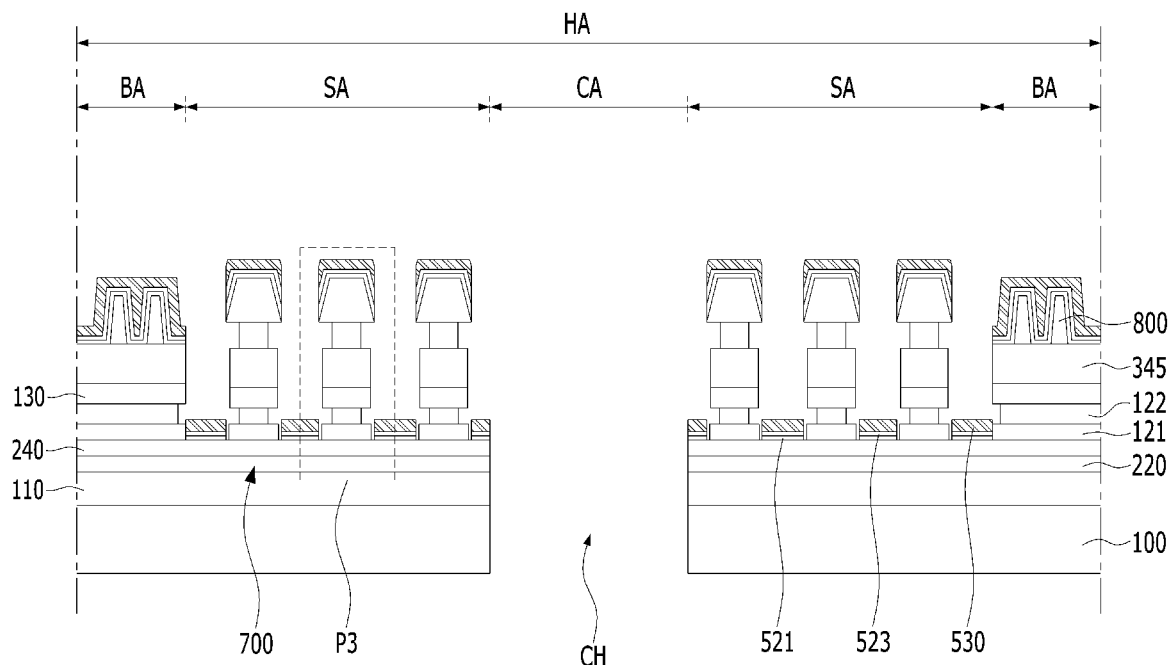
FIG. 8B is an enlarged view of an area P3 in FIG. 8A.
Figure 8B:
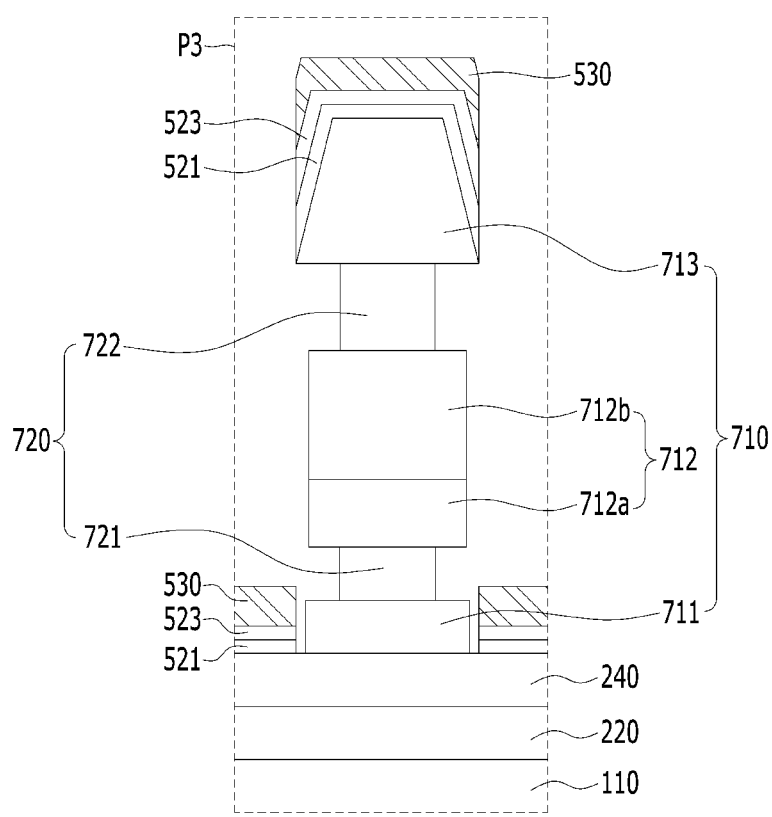
Figure 9:
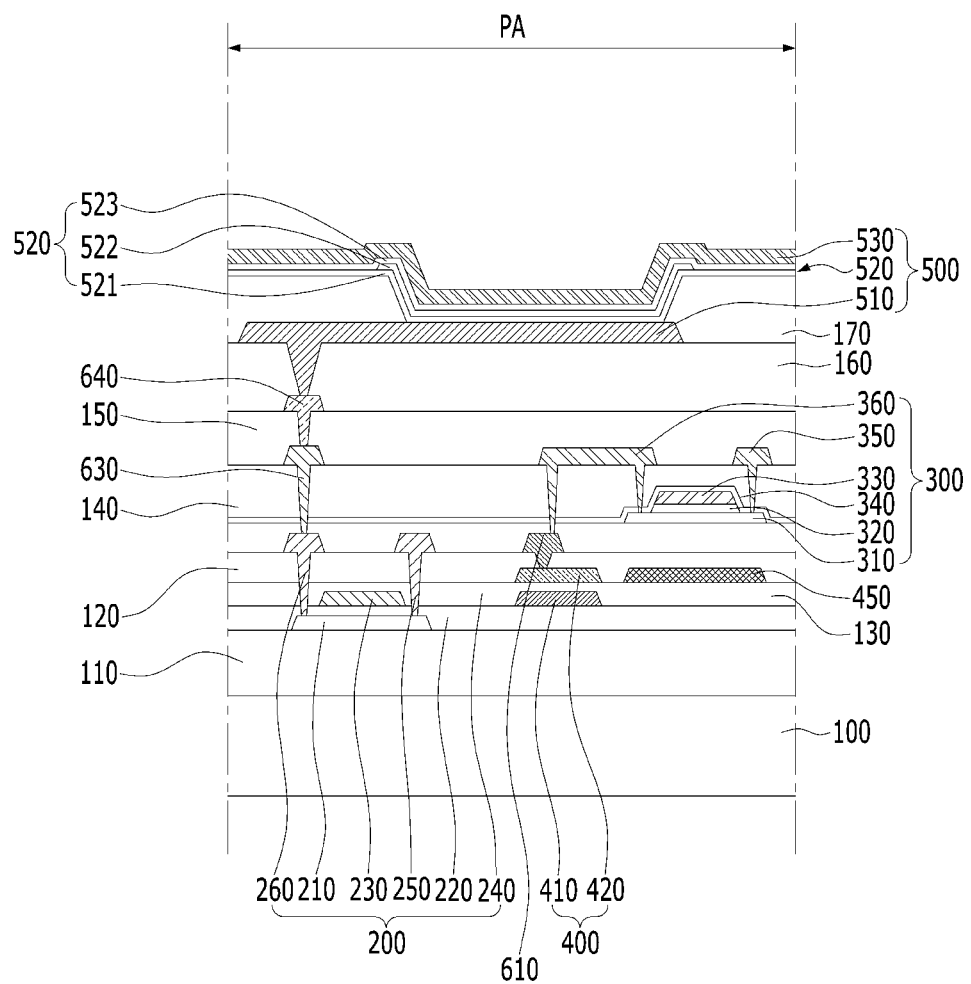
Figure 10A:
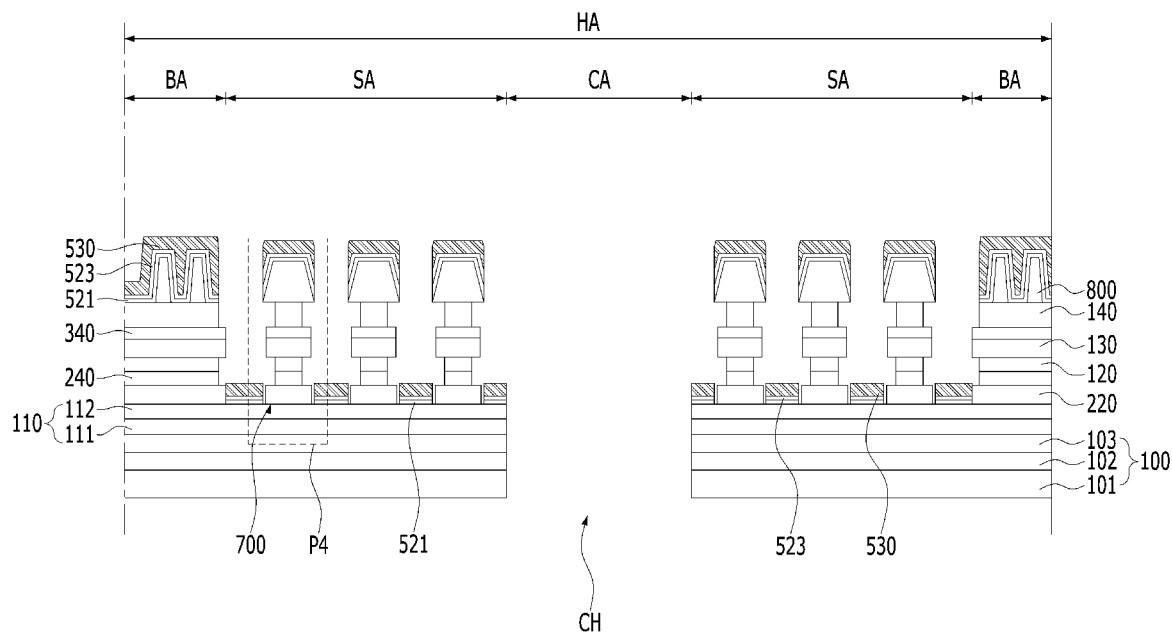
FIG. 10B is an enlarged view of an area P4 in FIG. 10A.
Figure 10B:
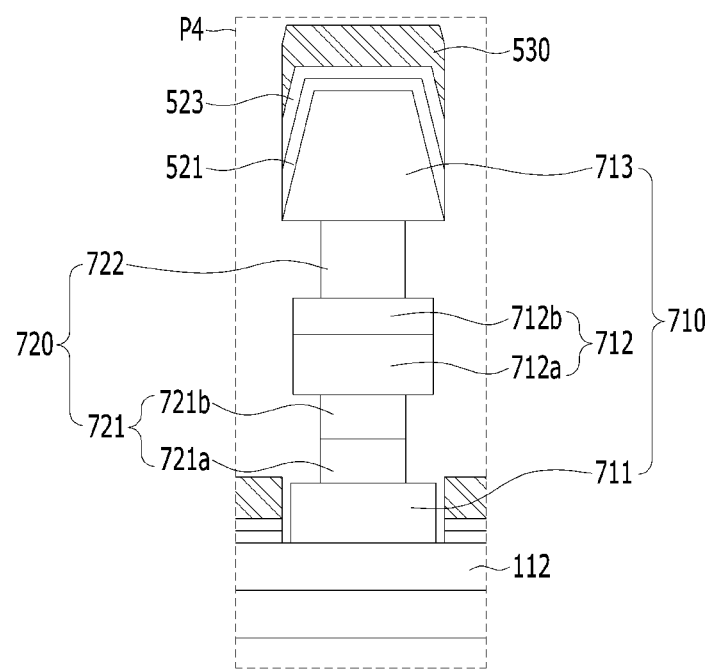
Figure 11:
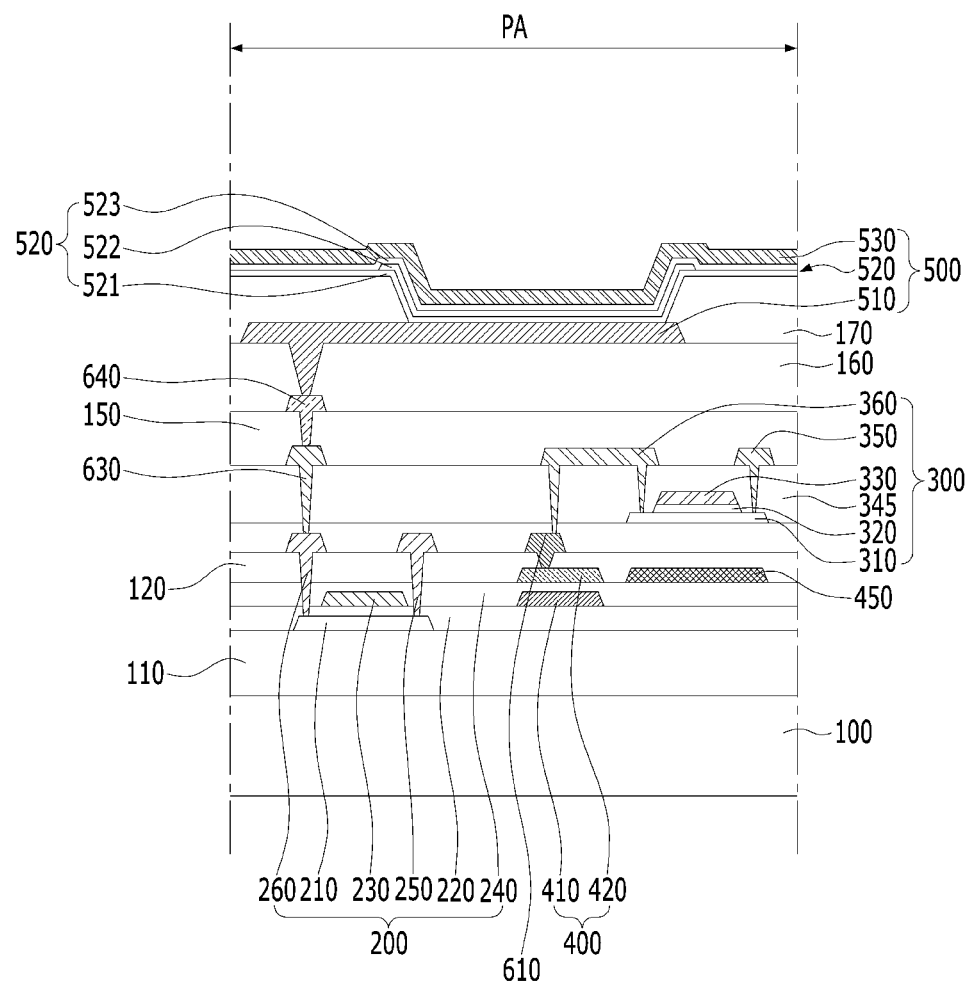
Figure 12A:
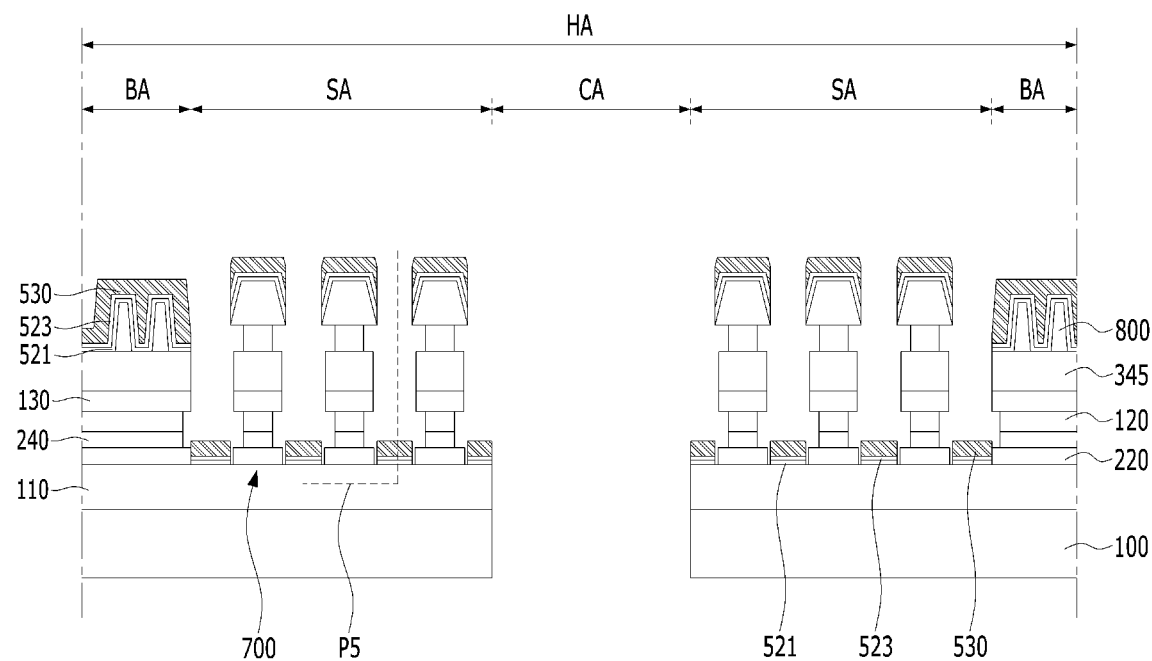
FIG. 12B is an enlarged view of an area P5 in FIG. 12A.
Figure 12B:
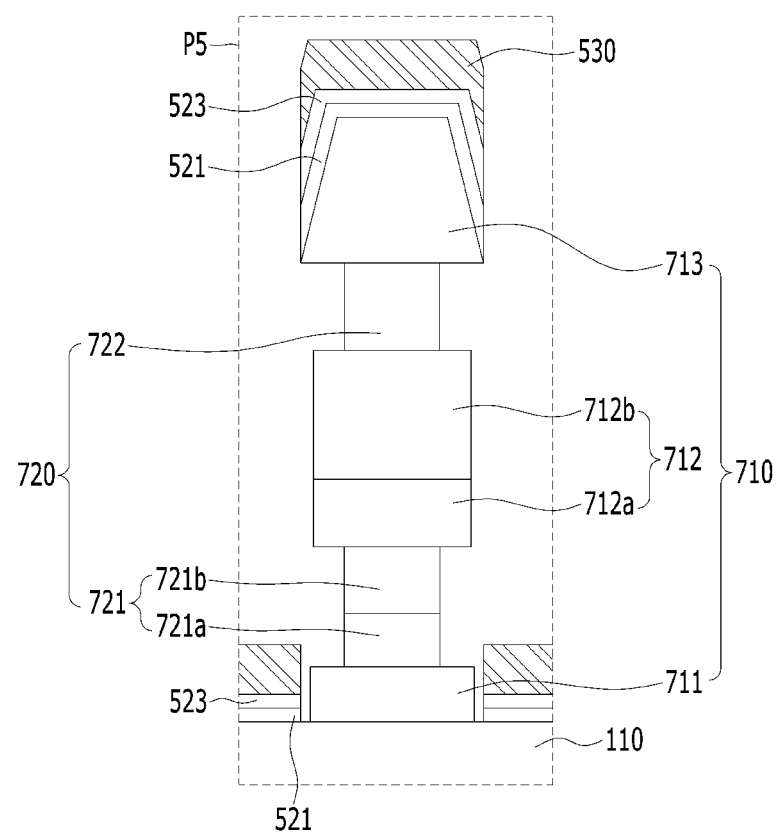
Figure 13:
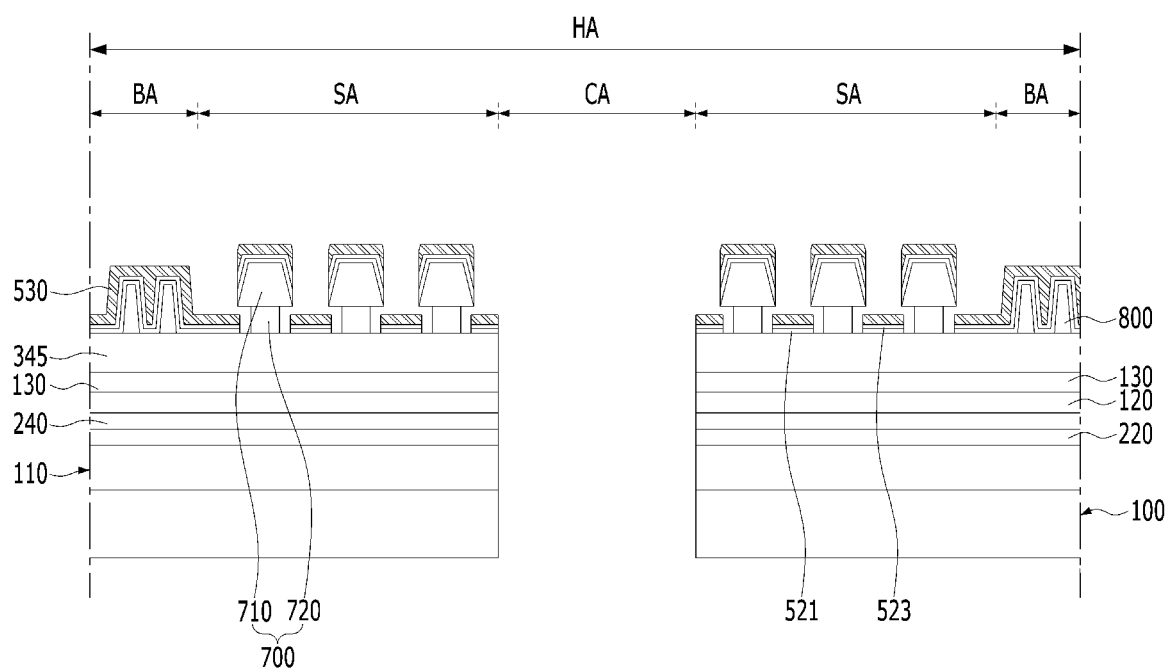
Figure 14A:
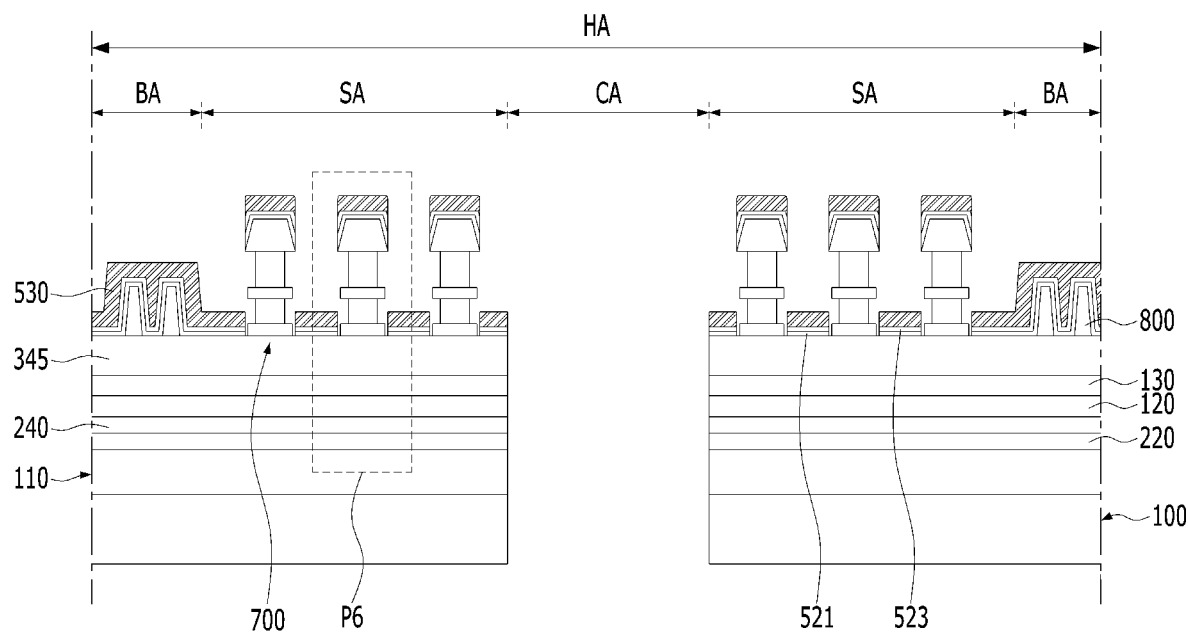
FIG. 14B is an enlarged view of an area P6 in FIG. 14A.
Figure 14B:
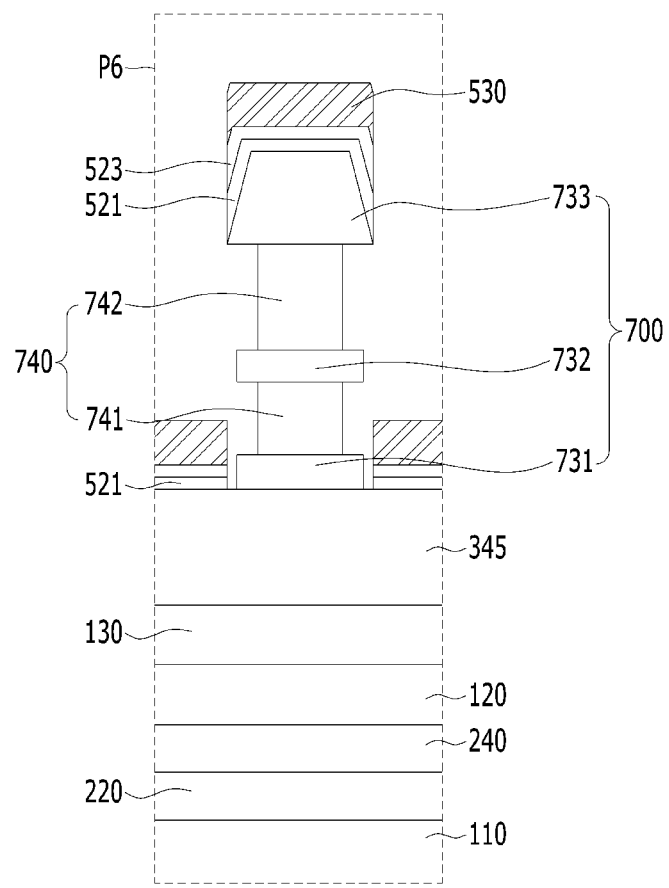
Figure 15A:
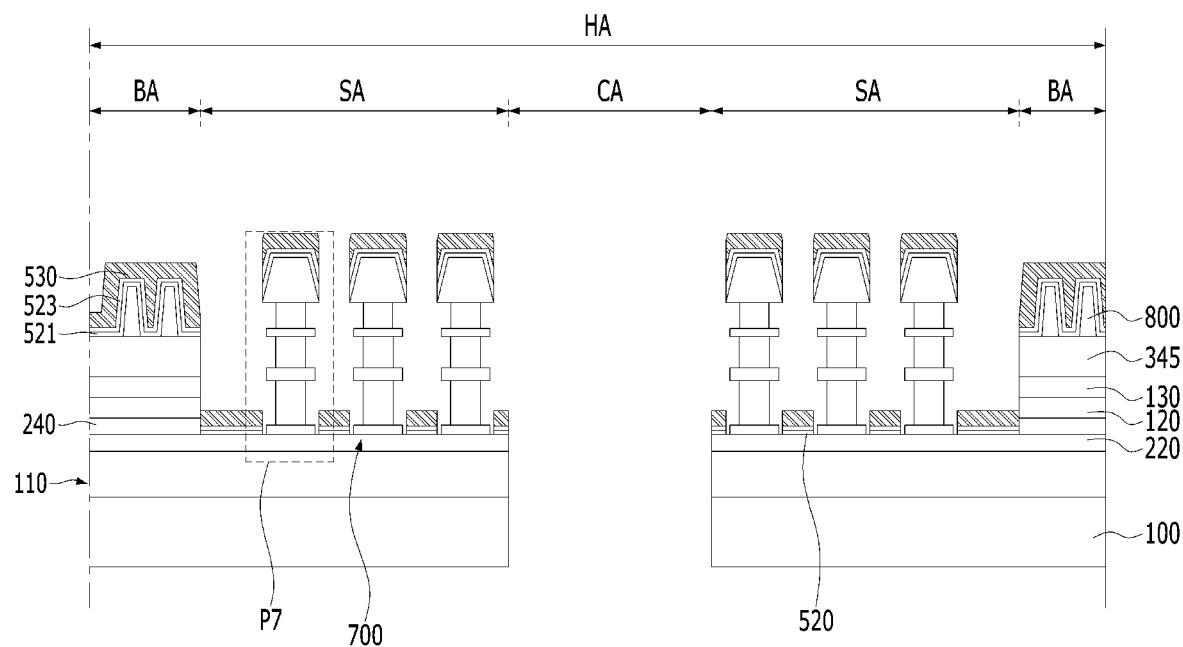
Figure 15B:
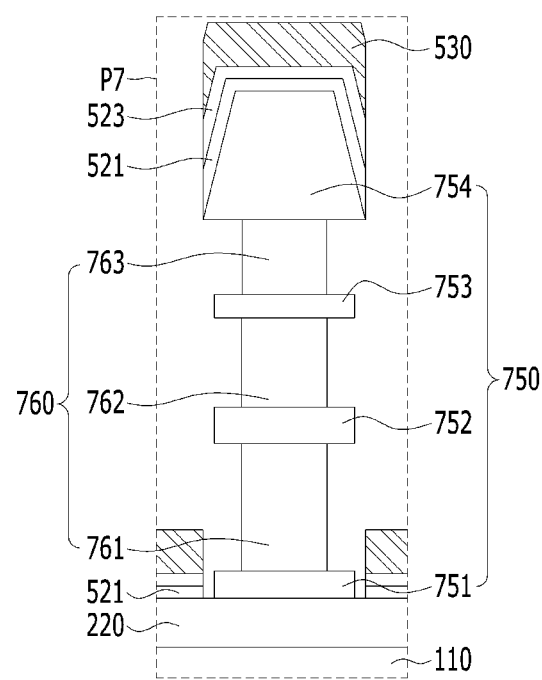

Particularly, FIGS. 6 to 15B are views respectively showing a display apparatus according to other embodiments of the present invention, where FIG. 7B is an enlarged view of an area P2 in FIG. 7A, FIG. 8B is an enlarged view of an area P3 in FIG. 8A, FIG. 10B is an enlarged view of an area P4 in FIG. 10A, FIG. 12B is an enlarged view of an area P5 in FIG. 12A, FIG. 14B is an enlarged view of an area P6 in FIG. 14A, and FIG. 15B is an enlarged view of an area P7 in FIG. 15A.

For example, the display apparatus according to another embodiment of the present invention can include the device substrate 100 having a single layer structure, and the buffer insulating layer 110 having a single layer structure, as shown in FIG. 6. Alternatively, in the display apparatus according to another embodiment of the present invention, only one of the device substrate 100 and the buffer insulating layer 110 can have a single layer structure.

The display apparatus according to the embodiment of the present invention is described that the second intermediate insulating layer 140 is disposed between the second interlayer insulating layer 340 and the first over-coat layer 150. However, in the display apparatus according to another embodiment of the present invention, the second thin film transistor 300 can include a passivation layer 345 insulating the second gate electrode 330 from the second source electrode 350 and the second drain electrode 360, as shown in FIGS. 6, 7A and 7B. For example, the passivation layer 345 can be disposed between the second gate electrode 330 and the second source electrode 350, and between the second gate electrode 330 and the second drain electrode 360. The passivation layer 345 can be in direct contact with the second gate electrode 330, the second source electrode 350 and the second drain electrode 360. The passivation layer 345 can include silicon oxide based material (SiOx). For example, in the display apparatus according to another embodiment of the present invention, an insulating layer including silicon nitride based material (SiNx) may not be disposed on the second semiconductor pattern 310 of the second thin film transistor 300. Thus, in the display apparatus according to another embodiment of the present invention, the deterioration of the second semiconductor pattern 310 including an oxide semiconductor due to hydrogen generated from an insulating layer including silicon nitride based material (SiNx) can be prevented.

The display apparatus according to the embodiment of the present invention is described that the wide patterns 710 and the narrow patterns 720 include an insulating material. However, in the display apparatus according to another embodiment of the present invention, the wide patterns 710 and/or the narrow patterns 720 can include a conductive material. For example, in the display apparatus according to another embodiment of the present invention, the separating device 700 can be disposed on the passivation layer 345, as shown in FIGS. 6, 7A and 7B. The separating device 700 can include a single wide pattern 710 and a single narrow pattern 720. For example, the separating device 700 can include the narrow pattern 720 and the wide pattern 710 which are sequentially stacked on the passivation layer 345.

The narrow pattern 720 can include a conductive material. The narrow pattern 720 can be disposed on the same layer as the second source electrode 350 and the second drain electrode 360 of the second thin film transistor 300. For example, the narrow pattern 720 can include the same material as the second source electrode 350 and the second drain electrode 360 of the second thin film transistor 300. The narrow pattern 720 can be formed by the same process as the second source electrode 350 and the second drain electrode 360 of the second thin film transistor 300. The narrow pattern 720 can have the same structure as the second source electrode 350 and the second drain electrode 360 of the second thin film transistor 300. For example, the narrow pattern 720 can have a three-layer structure in which an intermediate layer being composed of a titanium (Ti) metal layer is disposed between a lower layer and an upper layer which are composed of an aluminum (Al) metal layer. The wide pattern 710 can include the same material as one of the first over-coat layer 150, the second over-coat layer 160 and the bank insulating layer 170, which are disposed on the second source electrode 350 and the second drain electrode 360 of the second thin film transistor 300. Thus, in the display apparatus according to another embodiment of the present invention, the separating device 700 can be effectively formed. For example, in the display apparatus according to another embodiment of the present invention, the depth and the length of the under-cut structure due to the wide pattern 710 and the narrow pattern 720 can be easily controlled. Therefore, in the display apparatus according to another embodiment of the present invention, the separation of the second electrode 530 and the light-emitting layer 520 by the separating device 700 can be effectively performed. For example, the first organic layer 521 and the second organic layer 523 of the light-emitting layer 520 and the second electrode 530 can be separated in a plurality of patterns on the separating region SA by the separating device 700, as shown in FIG. 7A.

The display apparatus according to the embodiment of the present invention is described that the narrow patterns 720 includes the same material. However, in the display apparatus according to another embodiment of the present invention, the narrow patterns 720 can have a stacked structure of layers formed of different materials. For example, in the display apparatus according to another embodiment of the present invention, the separating device 700 can include a first wide pattern 711, a first narrow pattern 721, a second wide pattern 712, a second narrow pattern 722 and a third wide pattern 713, which are sequentially stacked on the first interlayer insulating layer 240, as shown in FIGS. 6, 8A and 8B. The first wide pattern 711 and the second wide pattern 712 can include silicon oxide based material (SiOx). The first wide pattern 711 can include the same material as the first intermediate layer 121 of the first intermediate insulating layer 120. The first wide pattern 711 can be disposed on the same layer as the first intermediate layer 121 of the first intermediate insulating layer 120.

The second wide pattern 712 can have a two-layer structure in which a lower wide layer 712a and an upper wide layer 712b are stacked. The lower wide layer 712a of the second wide pattern 712 can include the same material as the separation insulating layer 130. The lower wide layer 712a of the second wide pattern 712 can be disposed on the same layer as the separation insulating layer 130. The upper wide layer 712b of the second wide pattern 712 can include the same material as the passivation layer 345. The upper wide layer 712b of the second wide pattern 712 can be disposed on the same layer as the passivation layer 345.

The third wide pattern 713 can include the same material as one of the first over-coat layer 150, the second over-coat layer 160 and the bank insulating layer 170 which are disposed on the second source electrode 350 and the second drain electrode 360 of the second thin film transistor 300. For example, the third wide pattern 713 can include the same material as the second over-coat layer 160.

The first narrow pattern 721 can include the same material as the second intermediate layer 122 of the first intermediate insulating layer 120. For example, the first narrow pattern 721 can include silicon oxide based material (SiOx). The first narrow pattern 721 can be disposed on the same layer as the second intermediate layer 122 of the first intermediate insulating layer 120. The second narrow pattern 722 can include the same material as the second source electrode 350 and the second drain electrode 360 of the second thin film transistor 300. For example, the second narrow pattern 722 can be formed in the same structure as the second source electrode 350 and the second drain electrode 360. The second narrow pattern 722 can have a three-layer structure in which an intermediate layer being composed of a titanium (Ti) metal layer is disposed between a lower layer and an upper layer which are composed of an aluminum (Al) metal layer. Thus, in the display apparatus according to another embodiment of the present invention, the degree of freedom for configuration of the second narrow pattern 722 can be improved.

The display apparatus according to the embodiment of the present invention is described that the second thin film transistor 300 of each pixel PA is electrically connected to the first electrode 510 of the corresponding pixel PA. However, in the display apparatus according to another embodiment of the present invention, the first electrode 510 of each pixel PA can be electrically connected to the first thin film transistor 200 of the corresponding pixel PA, as shown in FIG. 9. For example, the display apparatus according to another embodiment of the present invention can include a third intermediate electrode 630 connected to the first drain electrode 260 of the first thin film transistor 200 by penetrating the separation insulating layer 130, the second interlayer insulating layer 340 and the second intermediate insulating layer 140, and a fourth intermediate electrode 640 connected to the third intermediate electrode 630 by penetrating the first over-coat layer 150. The first electrode 510 of each pixel PA can be connected to the fourth intermediate electrode 640 by penetrating the second over-coat layer 160. Thus, in the display apparatus according to another embodiment of the present invention, the degree of freedom for the location of each driving circuit can be improved.

The display apparatus according to the embodiment of the present invention is described that the second thin film transistor 300 including an oxide semiconductor is electrically connected to the first electrode 510 of the light-emitting device 500 to serve as a driving transistor, as shown in FIGS. 3 and 6. However, the display apparatus according to another embodiment of the present invention can include the first thin film transistor 200 including a poly silicon electrically connected to the first electrode 510 of the light-emitting device 500 to serve as a driving transistor, as shown in FIGS. 9, 10A and 10B. In the display apparatus according to another embodiment of the present invention, the first intermediate insulating layer 120 can be a single layer including silicon nitride based material (SiNx). However, the disclosure is not limited thereto. For example, the first intermediate insulating layer 120 can have a two-layer structure including a layer composed of silicon nitride based material (SiNx), and a layer composed of silicon oxide based material (SiOx).

In the display apparatus according to another embodiment of the present invention, the separating device 700 can include a first wide pattern 711, a first narrow pattern 721, a second wide pattern 712, a second narrow pattern 722 and a third wide pattern 713, which are sequentially stacked on the second buffer layer 112. The first wide pattern 711 and the second wide pattern 712 can include silicon oxide based material (SiOx). For example, the first wide pattern 711 can include the same material as the first gate insulating layer 220, and the second wide pattern 712 can have a stacked structure of a lower wide layer 712a including the same material as the separation insulating layer 130, and an upper wide layer 712b including the same material as the second interlayer insulating layer 340. The third wide pattern 713 can include the same material as one of the first over-coat layer 150, the second over-coat layer 160 and the bank insulating layer 170, which are disposed on the second source electrode 350 and the second drain electrode 360 of the second thin film transistor 300. For example, the third wide pattern 713 can be formed by a mask process of forming the second over-coat layer 160. The third wide pattern 713 can include the same material as the second over-coat layer 160. The first narrow pattern 721 and the second narrow pattern 722 can include silicon nitride based material (SiNx). For example, the first narrow pattern 721 can have a stacked structure of a lower narrow layer 721a including the same material as the first interlayer insulating layer 240, and an upper narrow layer 721b including the same material as the first intermediate insulating layer 120. The second narrow pattern 722 can include the same material as the second intermediate insulating layer 140. Thus, in the display apparatus according to another embodiment of the present invention, the degree of freedom for the configuration of the separating device 700 can be improved.

In the display apparatus according to another embodiment of the present invention, the second gate electrode 330 can be insulated from the second source electrode 350 and the second drain electrode 360 by the passivation layer 345, as shown in FIGS. 11, 12A and 12B. For example, in the display apparatus according to another embodiment of the present invention, the separating device 700 can include the first wide pattern 711, the first narrow pattern 721, the second wide pattern 712, the second narrow pattern 722 and the third wide pattern 713, which are sequentially stacked on the buffer insulating layer 110. The first wide pattern 711 can include the same material as the first gate insulating layer 220. The second wide pattern 712 can have a stacked structure of a lower wide layer 712a including the same material as the separation insulating layer 130, and an upper wide layer 712b including the same material as the passivation layer 345. The third wide pattern 713 can include the same material as one of the first over-coat layer 150, the second over-coat layer 160 and the bank insulating layer 170, which are disposed on the second source electrode 350 and the second drain electrode 360 of the second thin film transistor 300. For example, the third wide pattern 713 can be formed by a mask process of forming the second over-coat layer 160. The third wide pattern 713 can include the same material as the second over-coat layer 160. The first narrow pattern 721 can have a stacked structure of a lower narrow layer 721a including the same material as the first interlayer insulating layer 240, and an upper narrow layer 721b including the same material as the first intermediate insulating layer 120. The second narrow pattern 722 can include the same material as the second source electrode 350 and the second drain electrode 360 of the second thin film transistor 300. Thus, in the display apparatus according to another embodiment of the present invention, the separating device 700 can be effectively configured. The second narrow pattern 722 can have a three-layer structure composed of a lower layer, an intermediate layer and an upper layer similarly to the second source electrode 350 and the second drain electrode 360. For example, the lower layer and the upper layer of the second narrow pattern 722 can be composed of an aluminum (Al) metal layer, and the intermediate layer of the second narrow pattern 722 between the lower layer and the upper layer of the second narrow pattern 722 can be composed of a titanium (Ti) metal layer.

In the display apparatus according to another embodiment of the present invention, the second gate electrode 330 can be insulated from the second source electrode 350 and the second drain electrode 360 by the passivation layer 345, and the separating device 700 can include a single narrow pattern 720 and a single wide pattern 710, which are sequentially stacked on the passivation layer 345, as shown in FIGS. 11 and 13.

The narrow pattern 720 can include a conductive material. For example, the narrow pattern 720 can include the same material as the second source electrode 350 and the second drain electrode 360 of the second thin film transistor 300. The narrow pattern 720 can be disposed on the same layer as the second source electrode 350 and the second drain electrode 360 of the second thin film transistor 300. The narrow pattern 720 can be formed by the same process as the second source electrode 350 and the second drain electrode 360 of the second thin film transistor 300. For example, the second source electrode 350, the second drain electrode 360 and the narrow pattern 720 can have a structure in which a titanium (Ti) metal layer is disposed between aluminum (Al) metal layers. When the narrow pattern 720 includes the same material as the second source electrode 350 and the second drain electrode 360, the wide pattern 710 can include the same material as one of the first over-coat layer 150, the second over-coat layer 160 and the bank insulating layer 170. However, the disclosure is not limited thereto. For example, the narrow pattern 720 can include the same material as the fourth intermediate electrode 640 between the first over-coat layer 150 and the second over-coat layer 160. The narrow pattern 720 can be formed by the same process as the fourth intermediate electrode 640. When the narrow pattern 720 includes the same material as the fourth intermediate electrode 640, the wide pattern 710 can include the same material as one of the second over-coat layer 160 and the bank insulating layer 170. Thus, in the display apparatus according to another embodiment of the present invention, the under-cut structure can be formed by the wide pattern 710 and the narrow pattern 720, and the separation of the second electrode 530 and the light-emitting layer 520 can be effectively performed. For example, the first organic layer 521 and the second organic layer 523 of the light-emitting layer 520 and the second electrode 530 can be separated in a plurality of patterns on the separating region SA by the separating device 700, as shown in FIG. 13.

In the display apparatus according to another embodiment of the present invention, the separating device 700 can include the first wide pattern 731, the first narrow pattern 741, the second wide pattern 732, the second narrow pattern 742 and the third wide pattern 733, which are sequentially stacked on the passivation layer 345, as shown in FIGS. 14A and 14B. The first wide pattern 731 can include an organic insulating material same as the first over-coat layer 150. The first narrow pattern 741 can include a metal material same as the fourth intermediate electrode 640. The second wide pattern 732 can include an organic insulating material same as the second over-coat layer 160. The second narrow pattern 742 can include a metal material same as the first electrode 510. The third wide pattern 733 can include an organic insulating material same as the bank insulating layer 170. Thus, in the display apparatus according to another embodiment of the present invention, the wide patterns 731, 732 and 733 of the separating device 700 can be composed of an organic material layer, and the narrow patterns 741 and 742 of the separating device 700 can be composed of a metal material layer.

And, in the display apparatus according to another embodiment of the present invention, the separating device 700 can include the first wide pattern 751, the first narrow pattern 761, the second wide pattern 752, the second narrow pattern 762, the third wide pattern 753, the third narrow pattern 763 and the fourth wide pattern 754, which are sequentially stacked on the first gate insulating layer 220, as shown in FIGS. 15A and 15B. The first wide pattern 751 can include the same material as the first gate electrode 230 of the first thin film transistor 200. The second wide pattern 752 can include the same material as the first source electrode 250 and the first drain electrode 260 of the first thin film transistor 200. The third wide pattern 753 can include the same material as the second gate electrode 330 of the second thin film transistor 300. The fourth wide pattern 754 can include the same material as one of the first over-coat layer 150, the second over-coat layer 160 and the bank insulating layer 170. The first narrow pattern 761, the second narrow pattern 762 and the third narrow pattern 763 can include an insulating material. For example, the first narrow pattern 761 can have a stacked structure of a layer including the same material as the first interlayer insulating layer 240, and a layer including the same material as the first intermediate insulating layer 120. The first narrow pattern 761 can have the same thickness as a sum of a thickness of the first interlayer insulating layer 240 and a thickness of the first intermediate insulating layer 120. The second narrow pattern 762 can include the same material as the separation insulating layer 130 composed of silicon oxide based material (SiOx). The second narrow pattern 762 can be formed by the same mask process as the separation insulating layer 130. The third narrow pattern 763 can include the same material as the passivation layer 345 composed of silicon oxide based material (SiOx). The third narrow pattern 763 can be formed by the same mask process as the passivation layer 345. Thus, in the display apparatus according to another embodiment of the present invention, the degree of freedom for the configuration of the separating device 700 can be improved.

As a result, the display apparatus according to the embodiments of the present invention can include at least one separating device between the substrate hole and the light-emitting devices, wherein each of the light-emitting devices can include the light-emitting layer between the first electrode and the second electrode, wherein the separating device can include at least one under-cut structure, and wherein the under-cut structure can have the depth and the length greater than the thickness of the light-emitting layer. Thus, in the display apparatus according to the embodiments of the present invention, the moving path of the external moisture permeating through the substrate hole can be blocked by the separating device. Thereby, in the display apparatus according to the embodiments of the present invention, the lifetime and the reliability of the light-emitting devices can be improved.

What is claimed is:

1. A display apparatus comprising:
a substrate hole penetrating a device substrate;
a light-emitting device on the device substrate, the light-emitting device spaced apart from the substrate hole; and
at least one separating device between the substrate hole and the light-emitting device, the at least one separating device including a first pattern, at least one narrow pattern and at least one wide pattern, a width of the at least one narrow pattern being smaller than a width of the first pattern and a width of the at least one wide pattern,
wherein the light-emitting device includes a first electrode, a light-emitting layer and a second electrode, which are sequentially stacked,
wherein the at least one narrow pattern and the at least one wide pattern are alternately stacked on the first pattern in this order, so that each of the at least one separating device includes at least one under-cut structure,
wherein a depth and a length of the at least one under-cut structure are larger than a thickness of the light-emitting layer, and
wherein the width of the first pattern is smaller than a width of a lower surface of the at least one wide pattern disposed at an uppermost portion of the at least one separating device.

2. The display apparatus according to claim 1, wherein the at least one narrow pattern includes a material different from the first pattern and the at least one wide pattern.

3. The display apparatus according to claim 1, wherein the depth of the at least one under-cut structure is defined by a thickness of the at least one narrow pattern, and
the length of the at least one under-cut structure is defined by a distance between a side surface of the at least one wide pattern and a side surface of the at least one narrow pattern.

4. The display apparatus according to claim 1, wherein at least one of the at least one narrow pattern includes a conductive material.

5. The display apparatus according to claim 1, further comprising:
at least one dam disposed between the light-emitting device and the at least one separating device.

6. The display apparatus according to claim 1, further comprising:
a driving circuit configured to drive the light-emitting device, the driving circuit including a first thin film transistor on the device substrate and a second thin film transistor between the first thin film transistor and the light-emitting device,
wherein the at least one separating device is formed by a process of forming the driving circuit and the light-emitting device.

7. The display apparatus according to claim 6, wherein the first thin film transistor includes a semiconductor pattern having a low-temperature poly-silicon (LTPS), and the second thin film transistor includes a semiconductor pattern having an oxide semiconductor.

8. The display apparatus according to claim 6, wherein at least one of the at least one wide pattern includes a conductive material that is same as one of the following:
an electrode of the first thin film transistor,
an electrode of the second thin film transistor, or
the first electrode of the light-emitting device.

9. The display apparatus according to claim 6, wherein each of the at least one wide pattern includes an insulating material that is same as one of the following:
an insulating layer inside the first thin film transistor,
an insulating layer inside the second thin film transistor,
an insulating layer between the first thin film transistor and the second thin film transistor,
an insulating layer between the second thin film transistor and the light-emitting device, or
an insulating layer between adjacent light-emitting devices.

10. A display apparatus comprising:
a device substrate including a first region, a second region surrounding the first region, and a third region disposed outside the second region;
a substrate hole penetrating the first region of the device substrate;
a light-emitting device on the third region of the device substrate, the light-emitting device including a light-emitting layer between a first electrode and a second electrode; and
at least one separating device on the second region of the device substrate,
wherein each of the at least one separating device includes a first pattern, at least one wide pattern and at least one narrow pattern, the at least one narrow pattern and the at least one the at least one wide pattern being alternately disposed on the first pattern in this order,
wherein the at least one narrow pattern has a smaller width than each of the first pattern and the at least one wide pattern, and a thickness of the at least one narrow pattern is larger than a thickness of the light-emitting layer,
wherein a distance between a side surface of the at least one wide pattern and a side surface of the at least one narrow pattern is larger than the thickness of the light-emitting layer, and
wherein a width of the first pattern is smaller than a width of a lower surface of the at least one wide pattern disposed at an uppermost portion of the at least one separating device.

11. The display apparatus according to claim 10, wherein the at least one wide pattern and the at least one narrow pattern include an insulating material.

12. The display apparatus according to claim 10, further comprising a thin film transistor between the device substrate and the light-emitting device,
wherein the at least one narrow pattern includes a same material as an insulating layer of the thin film transistor.

13. The display apparatus according to claim 12, further comprising an over-coat layer between the thin film transistor and the light-emitting device,
wherein the at least one wide pattern disposed at the uppermost portion of the at least one separating device includes a same material as the over-coat layer.

14. The display apparatus according to claim 12, wherein the at least one narrow pattern includes silicon oxide-based material.

15. The display apparatus according to claim 10, wherein the light-emitting layer is formed on the second region and the third region of the device substrate, and
wherein the light-emitting layer on the second region is separated from the light-emitting layer on the third region by the at least one separating device.

16. The display apparatus according to claim 15, wherein the light-emitting layer on the third region is separated into a plurality of patterns by the at least one separating device.

17. A display apparatus comprising:
a substrate hole penetrating a device substrate;
a light-emitting device on the device substrate, the light-emitting device spaced apart from the substrate hole; and
at least one separating device between the substrate hole and the light-emitting device,
wherein the light-emitting device includes a first electrode, a light-emitting layer and a second electrode, which are sequentially stacked,
wherein the at least one separating device includes:
a first wide pattern;
a first narrow pattern disposed on the first wide pattern;
a second wide pattern disposed on the first narrow pattern;
a second narrow pattern disposed on the second wide pattern;
a third wide pattern disposed on the second narrow pattern;
a third narrow pattern disposed on the third wide pattern; and
a fourth wide pattern disposed on the third narrow pattern,
wherein each of the first, second, third and fourth wide patterns is wider than each of the first, second and third narrow patterns, and
wherein a width of the first wide pattern is smaller than a width of a lower surface of the fourth wide pattern.

18. The display apparatus according to claim 17, wherein the at least one separating device further includes a first under-cut structure corresponding to the first narrow pattern, a second under-cut structure corresponding to the second narrow pattern, and a third under-cut structure corresponding to the third narrow pattern.

19. The display apparatus according to claim 17, wherein at least one of the first, second, third or fourth wide patterns has a two-layer structure in which a lower wide layer and an upper wide layer are stacked.

20. The display apparatus according to claim 19, wherein the lower wide layer includes a same material as the upper wide layer.

* * * * *